(12) United States Patent
Abuku

(10) Patent No.: US 7,016,755 B2
(45) Date of Patent: Mar. 21, 2006

(54) INFORMATION PROCESSING METHOD AND APPARATUS USED IN AN EXPOSURE SYSTEM AND EXPOSURE APPARATUS

(75) Inventor: Yuji Abuku, Tochigi (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 10/728,817

(22) Filed: Dec. 8, 2003

(65) Prior Publication Data

US 2004/0117056 A1  Jun. 17, 2004

(30) Foreign Application Priority Data

Dec. 9, 2002  (JP) ............................. 2002-356735

(51) Int. Cl.
*G06F 19/00*  (2006.01)
*G06F 15/00*  (2006.01)
*G06F 15/16*  (2006.01)
*G05B 19/42*  (2006.01)

(52) U.S. Cl. .................... 700/121; 700/87; 700/97; 700/108; 715/530; 715/961; 709/200

(58) Field of Classification Search .................. 700/9, 700/17, 83, 87, 95, 96, 98, 105, 108, 109, 700/110, 117, 121, 97; 438/5, 7, 14, 16; 716/21; 709/200; 715/530, 700, 961, 964, 715/965
See application file for complete search history.

(56) References Cited

U.S. PATENT DOCUMENTS

| | | | | |
|---|---|---|---|---|
| 4,586,141 A | * | 4/1986 | Yasuda et al. ................. | 716/21 |
| 5,969,972 A | * | 10/1999 | Kerszykowski et al. .... | 700/121 |
| 6,016,391 A | * | 1/2000 | Facchini et al. .............. | 716/21 |
| 6,128,403 A | * | 10/2000 | Ozaki .......................... | 382/145 |
| 6,314,548 B1 | * | 11/2001 | Suzuki ......................... | 716/11 |
| 6,629,002 B1 | * | 9/2003 | Holder ......................... | 700/96 |
| 6,711,731 B1 | * | 3/2004 | Weiss .......................... | 716/19 |
| 2002/0095644 A1 | * | 7/2002 | Weiss .......................... | 716/19 |
| 2003/0025732 A1 | * | 2/2003 | Prichard ..................... | 345/765 |

OTHER PUBLICATIONS

The Microsoft Computer Dictionary 1999, 4th edition, Microsoft Press, pp. 161.*

* cited by examiner

*Primary Examiner*—Leo Picard
*Assistant Examiner*—Sean Shechtman
(74) *Attorney, Agent, or Firm*—Fitzpatrick, Cella, Harper & Scinto

(57) ABSTRACT

An information processing apparatus used for an exposure system. The apparatus includes a generation unit which generates a parameter file described in a markup language based on a parameter used in the exposure system, the parameter file including information for displaying an image concerning at least one of a shot layout and a sample shot for an exposure process to be performed by the exposure system, and a program for editing the image, and a providing unit which provides the parameter file to another information processing apparatus out of the exposure system.

9 Claims, 22 Drawing Sheets

FIG. 10A

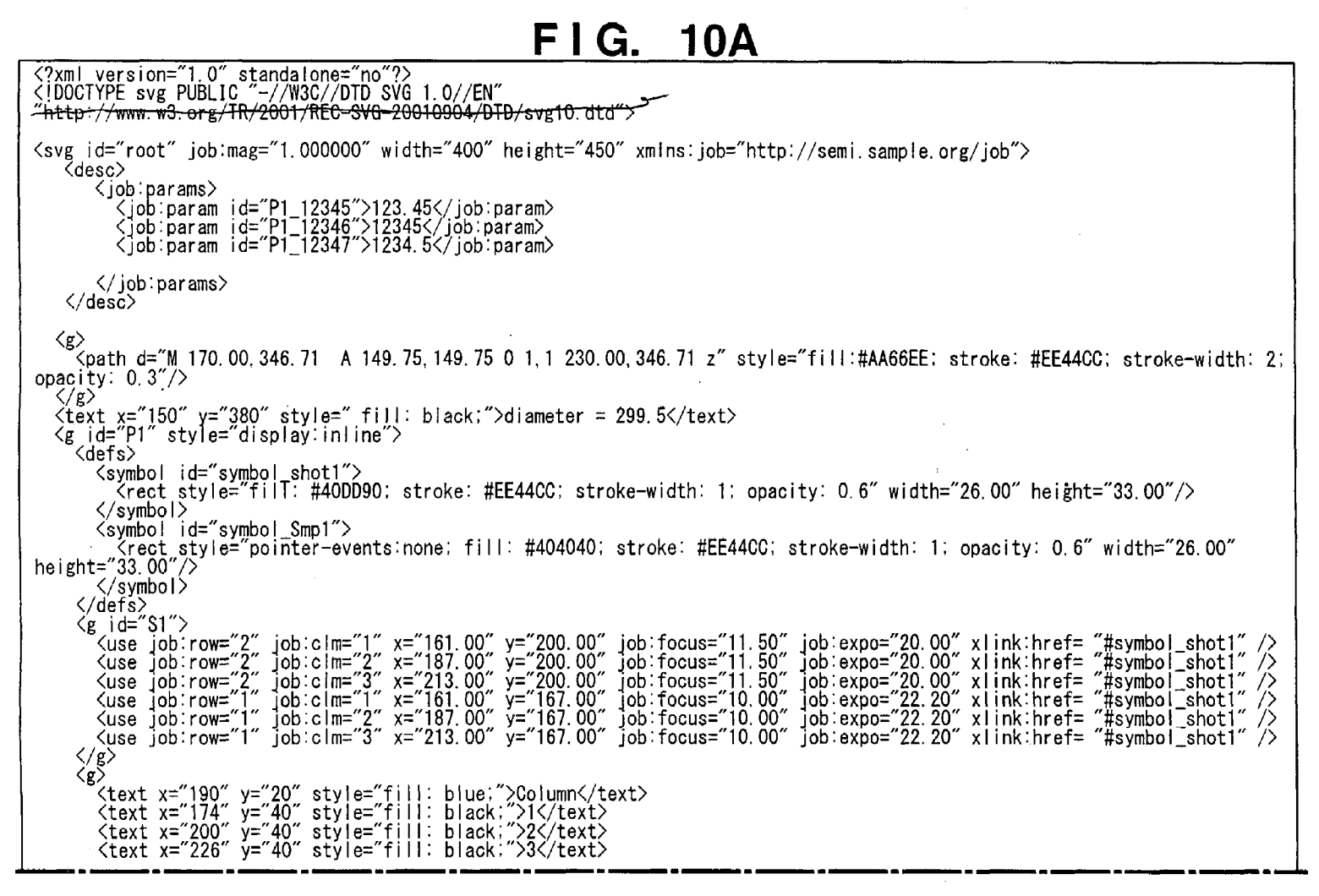

```
<?xml version="1.0" standalone="no"?>
<!DOCTYPE svg PUBLIC "-//W3C//DTD SVG 1.0//EN"
"http://www.w3.org/TR/2001/REC-SVG-20010904/DTD/svg10.dtd">

<svg id="root" job:mag="1.000000" width="400" height="450" xmlns:job="http://semi.sample.org/job">
  <desc>
    <job:params>
      <job:param id="P1_12345">123.45</job:param>
      <job:param id="P1_12346">12345</job:param>
      <job:param id="P1_12347">1234.5</job:param>
    </job:params>
  </desc>

<g><path d="M 170.00,346.71 A 149.75,149.75 0 1,1 230.00,346.71 z" style="fill:black;">diameter = 299.5</text>
<text x="150" y="380" style="fill:#AA66EE; stroke:#EE4CC; stroke-width: 2; opacity: 0.3"/>
<g id="P1" style="display:inline">
<defs>
<symbol id="symbol_shot1">
  <rect style="fill:#40DD90; stroke:#EE4CC; stroke-width: 1; opacity: 0.6" width="26.00" height="33.00"/>
</symbol>
<symbol id="symbol_Smp1">
  <rect style="pointer-events:none; fill:#404040; stroke:#EE4CC; stroke-width: 1; opacity: 0.6" width="26.00"
height="33.00"/>
</symbol>
</defs>
<g id="S1">
  <use job:row="2" job:clm="1" x="161.00" y="200.00" job:focus="11.50" job:expo="20.00" xlink:href="#symbol_shot1"/>
  <use job:row="2" job:clm="2" x="187.00" y="200.00" job:focus="11.50" job:expo="20.00" xlink:href="#symbol_shot1"/>
  <use job:row="2" job:clm="3" x="213.00" y="200.00" job:focus="11.50" job:expo="20.00" xlink:href="#symbol_shot1"/>
  <use job:row="1" job:clm="1" x="161.00" y="167.00" job:focus="10.00" job:expo="20.00" xlink:href="#symbol_shot1"/>
  <use job:row="1" job:clm="2" x="187.00" y="167.00" job:focus="10.00" job:expo="22.20" xlink:href="#symbol_shot1"/>
  <use job:row="1" job:clm="3" x="213.00" y="167.00" job:focus="10.00" job:expo="22.20" xlink:href="#symbol_shot1"/>
</g>
<text x="190" y="20" style="fill:blue;">Column</text>
<text x="174" y="40" style="fill:black;">1</text>
<text x="200" y="40" style="fill:black;">2</text>
<text x="226" y="40" style="fill:black;">3</text>
```

F I G. 10B

```
<text x="20" y="190" style="fill:blue; writing-mode:tb; glyph-orientation-vertical:0">Row</text>
<text x="40" y="184" style="fill: black;">1</text>
<text x="40" y="217" style="fill: black;">2</text>
</g>
<g id = "GTILT1" style="display:none">
<use job:row="1" job:clm="2" x="187.00" y="167.00" xlink:href= "#symbol_Smp1"/>
<text x="200" y="184" style="fill: red;">1</text>
<use job:row="2" job:clm="1" x="161.00" y="200.00" xlink:href= "#symbol_Smp1"/>
<text x="174" y="217" style="fill: red;">2</text>
<use job:row="2" job:clm="2" x="187.00" y="200.00" xlink:href= "#symbol_Smp1"/>
<text x="200" y="217" style="fill: red;">3</text>
<use job:row="1" job:clm="3" x="213.00" y="167.00" xlink:href= "#symbol_Smp1"/>
<text x="226" y="184" style="fill: red;">4</text>
<set attributeName="display" attributeType="css" to="inline" begin="GTILT1_SEL.click" dur="1s" />
</g>
<g id = "TP0C1" style="display:none">
<use job:row="1" job:clm="3" x="213.00" y="167.00" xlink:href= "#symbol_Smp1"/>
<text x="226" y="184" style="fill: red;">1</text>
<use job:row="2" job:clm="1" x="161.00" y="200.00" xlink:href= "#symbol_Smp1"/>
<text x="174" y="217" style="fill: red;">2</text>
<use job:row="2" job:clm="2" x="187.00" y="200.00" xlink:href= "#symbol_Smp1"/>
<text x="200" y="217" style="fill: red;">3</text>
<use job:row="1" job:clm="2" x="187.00" y="167.00" xlink:href= "#symbol_Smp1"/>
<text x="200" y="184" style="fill: red;">4</text>
<set attributeName="display" attributeType="css" to="inline" begin="TP0C1_SEL.click" dur="1s" />
</g>
</g> <g id="GTILT1_SEL">
<ellipse cx="50" cy="420" rx="40.5" ry="11.5"
    style="fill:rgb(192,192,255);stroke:rgb(0,0,0);stroke-width:1"/>
<text x="25" y="427" style="fill:rgb(0,0,0);font-size:18;">GTILT</text>
</g>
<g id="TP0C1_SEL">
<ellipse cx="150" cy="420" rx="40.5" ry="11.5"
    style="fill:rgb(192,192,255);stroke:rgb(0,0,0);stroke-width:1"/>
<text x="125" y="427" style="fill:rgb(0,0,0);font-size:18;">TP0C</text>
</g>
</svg>
```

FIG. 17A

```
<?xml version="1.0" standalone="no" ?>
<!DOCTYPE svg PUBLIC "-//W3C//DTD SVG 1.0//EN"
"http://www.w3.org/TR/2001/REC-SVG-20010904/DTD/svg10.dtd">
<?AdobeSVGViewer save="snapshot"?>

<svg id="root" job:mag="1.000000" width="400" height="450" xmlns="http://www.w3.org/2000/svg"
  xmlns:xlink="http://www.w3.org/1999/xlink" xmlns:job="http://semi.sample.org/job">
  <desc>
    <job:params>
      <job:param id="P1_12345">123.45</job:param>
      <job:param id="P1_12346">12345</job:param>
      <job:param id="P1_12347">1234.5</job:param>
    </job:params>
  </desc>
  <g>
    <path d="M 170.00,346.71 A 149.75,149.75 0 1,1 230.00,346.71 z" style="fill:#AA66EE; stroke: #EE44CC; stroke-width: 2;
opacity: 0.3" onclick="wmdown(evt)"/>
    <text x="150" y="380" style=" fill: black;">diameter = 299.5</text>
  </g>
  <g id="P1" style="display:inline" job:stepx="26.00" job:stepy="33.00">
  <defs>
    <symbol id="symbol_shot1">
      <rect style="fill: #40DD90; stroke: #EE44CC; stroke-width: 1; opacity: 0.6" width="26.00" height="33.00"/>
    </symbol>
  </defs>
  <g id="S1">
    <use job:row="2" job:clm="1" x="161.00" y="200.00" job:focus="11.50" job:expo="20.00" xlink:href= "#symbol_shot1"
onclick="smdown(evt)"/>
    <use job:row="2" job:clm="2" x="187.00" y="200.00" job:focus="11.50" job:expo="20.00" xlink:href= "#symbol_shot1"
onclick="smdown(evt)"/>
    <use job:row="2" job:clm="3" x="213.00" y="200.00" job:focus="11.50" job:expo="20.00" xlink:href= "#symbol_shot1"
onclick="smdown(evt)"/>
    <use job:row="1" job:clm="1" x="161.00" y="167.00" job:focus="10.00" job:expo="22.20" xlink:href= "#symbol_shot1"
onclick="smdown(evt)"/>
    <use job:row="1" job:clm="2" x="187.00" y="167.00" job:focus="10.00" job:expo="22.20" xlink:href= "#symbol_shot1"
onclick="smdown(evt)"/>
    <use job:row="1" job:clm="3" x="213.00" y="167.00" job:focus="10.00" job:expo="22.20" xlink:href= "#symbol_shot1"
onclick="smdown(evt)"/>
  </g>
  </g>
```

F I G. 17B

```
<text x="190" y="20" style="fill: blue;">Column</text>
<text x="174" y="40" style="fill: black;">1</text>
<text x="200" y="40" style="fill: black;">2</text>
<text x="226" y="40" style="fill: black;">3</text>
<text x="20" y="190" style="fill: blue; writing-mode:tb; glyph-orientation-vertical:0">Row</text>
<text x="40" y="184" style="fill: black;">1</text>
<text x="40" y="217" style="fill: black;">2</text>
</g>
</g>
<script>
function wmdown(evt)
{
    var p1= svgDocument.getElementById("P1");
    var stepx = p1.getAttribute("job:stepx");
    var stepy = p1.getAttribute("job:stepy");
    var node0 = p1.getElementsByTagName("use").item(0);
    var sx0=node0.getAttribute("x");
    var sy0=node0.getAttribute("y");
    var row0=node0.getAttribute("job:row");
    var clm0=node0.getAttribute("job:clm");
    var x = evt.getClientX();
    var y = evt.getClientY();
    var dc = Math.round((parseFloat(x) - (parseFloat(sx0) + stepx/2))/stepx);
    var dr = Math.round((parseFloat(y) - (parseFloat(sy0) + stepy/2))/stepy);
    var tmpc = parseInt(clm0) + dc;
    var tmpr = parseInt(row0) + dr;
    var nodec = node0.cloneNode(true);
    nodec.setAttribute("x", Math.round(parseFloat(sx0) + dc * stepx));
    nodec.setAttribute("y", Math.round(parseFloat(sy0) + dr * stepy));
    nodec.setAttribute("job:row", tmpr);
    nodec.setAttribute("job:clm", tmpc);
    node0.getParentNode().appendChild(nodec);
} function smdown(evt)
{
    if(evt.getTarget().getParentNode().getElementsByTagName("use").length >= 2)
        evt.getTarget().getParentNode().removeChild(evt.getTarget());
}
</script>
</svg>
```

INFORMATION PROCESSING METHOD AND APPARATUS USED IN AN EXPOSURE SYSTEM AND EXPOSURE APPARATUS

FIELD OF THE INVENTION

The present invention relates to an information processing technique used for an exposure system.

BACKGROUND OF THE INVENTION

Conventionally, a job parameter file for use in controlling an exposure apparatus has only parameters exclusively used to control the exposure apparatus. For example, to see the layout pattern of exposure shots or sample shots which are appropriately selected for various measurements, a job parameter file is loaded from a predetermined memory into the exposure apparatus, and then an application designed specifically for the apparatus is utilized.

FIG. 7 is a conceptual diagram showing an outline of the process flow of a job parameter file 701. A console unit 330 shown in FIG. 7 corresponds to the console unit 330 in FIG. 3. The console unit 330 can write the job parameter file 701 from an exposure system 601. The console unit 330 can also cause the exposure system 601 to read the job parameter file 701 stored in a memory 332 (see FIG. 3) of the console unit. An application designed specifically to cause an output unit 102 such as a display to display an image of, e.g., the layout pattern of exposure shots in accordance with the job parameter file 701 is stored in the memory 332 of the console unit 330. Programming of this dedicated application through Motif of the X-Window System using a programming language such as C language requires at least several thousand steps and thus a large number of working hours.

Recently, demands for handling jobs with a processing apparatus (e.g., a personal computer) other than an exposure apparatus to confirm the layout pattern of exposure shots or demands for editing a job parameter file using a processing apparatus other than an exposure apparatus have been increasing.

To see the layout pattern and the like by a processing apparatus other than an exposure apparatus, however, they must be displayed. This needs to create an application dedicated to each processing apparatus and install the application in each personal computer. As described above, a large amount of work is required to display the layout pattern and the like for confirmation of the contents of a job parameter file by the user with a processing apparatus other than an exposure apparatus. Therefore, the above-mentioned demands cannot be satisfied.

In addition, to edit a job parameter file with a processing apparatus other than an exposure apparatus, the above-mentioned dedicated application must be adapted to the processing apparatus, and a program including more steps must be created. For this reason, it is difficult to increase working efficiency covering the control parameter used in the exposure apparatus.

SUMMARY OF THE INVENTION

The present invention has been made in consideration of the above problems, and has as its object to increase working efficiency covering a control parameter used in an exposure system.

According to a first aspect of the present invention, there is provided an information processing apparatus which processes information of a control parameter used in an exposure system, comprising an acquisition unit which acquires, from the exposure system, the parameter information and format information required to inform a user with respect to the control, based on the parameter information, and a generation unit which generates information to be informed to a user with respect to the control based on the parameter information and the format information.

According to a preferred embodiment of the present invention, the generation unit preferably includes a converting unit which converts the parameter information into information compliant with the format information.

According to a preferred embodiment of the present invention, the generation unit preferably generates the information to be informed based on the information obtained by the converting unit and the format information.

According to a preferred embodiment of the present invention, the generation unit preferably includes a condition setting unit which sets an image display condition.

According to a preferred embodiment of the present invention, the acquisition unit preferably acquires software for editing at least one of the parameter information and the format information together with the parameter information and the format information.

According to a preferred embodiment of the present invention, the software preferably includes a program.

According to a preferred embodiment of the present invention, the software is preferably described in one of a mark language and a script language.

According to a preferred embodiment of the present invention, the information to be informed preferably includes information about at least one of a shot layout and a sample shot.

According to a second aspect of the present invention, there is provided an information processing method of processing information of a control parameter used in an exposure system comprising steps of acquiring, from the exposure system, the parameter information and format information required to inform a user with respect to the control based on the parameter information, and generating information to be informed to a user with respect to the control based on the parameter information and the format information.

According to a third aspect of the present invention, there is provided an information processing apparatus used for an exposure system, the apparatus comprising a generation unit which generates format information required to inform a user with respect to a control parameter used in the exposure system, based on the control parameter, and an output unit which outputs the parameter information and the format information out of the apparatus.

According to a preferred embodiment of the present invention, the output unit preferably outputs software for editing at least one of the parameter information and the format information together with the parameter information and the format information.

According to a preferred embodiment of the present invention, the software preferably includes a program.

According to a preferred embodiment of the present invention, the software is preferably described in one of a markup language and a script language.

According to a preferred embodiment of the present invention, the apparatus further comprises a reception unit which receives the control parameter from the exposure system.

According to a preferred embodiment of the present invention, the output unit preferably transmits the parameter information and the format information to another information processing apparatus.

According a preferred embodiment of the present invention, the apparatus further comprises a transmitting unit which transmits a control parameter edited using the software to the exposure system.

According to a preferred embodiment of the present invention, information to be informed preferably based on the format information includes information about at least one of a shot layout and a sample shot.

According to a fourth aspect of the present invention, there is provided a method adapted to an information processing apparatus used for an exposure system, the method comprising steps of generating format information required to inform a user with respect to a control parameter used in the exposure system, based on the control parameter, and outputting the parameter information and the format information out of the apparatus.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 10A and 10B are views showing examples of image display information according to the first embodiment;

FIGS. 17A and 17B show examples of image display information according to the second embodiment;

DETAILED DESCRIPTION OF THE PREFERRED EMBODIMENTS

Preferred embodiments of the present invention will now be described in detail in accordance with the accompanying drawings.

[First Embodiment]

Figure 1:
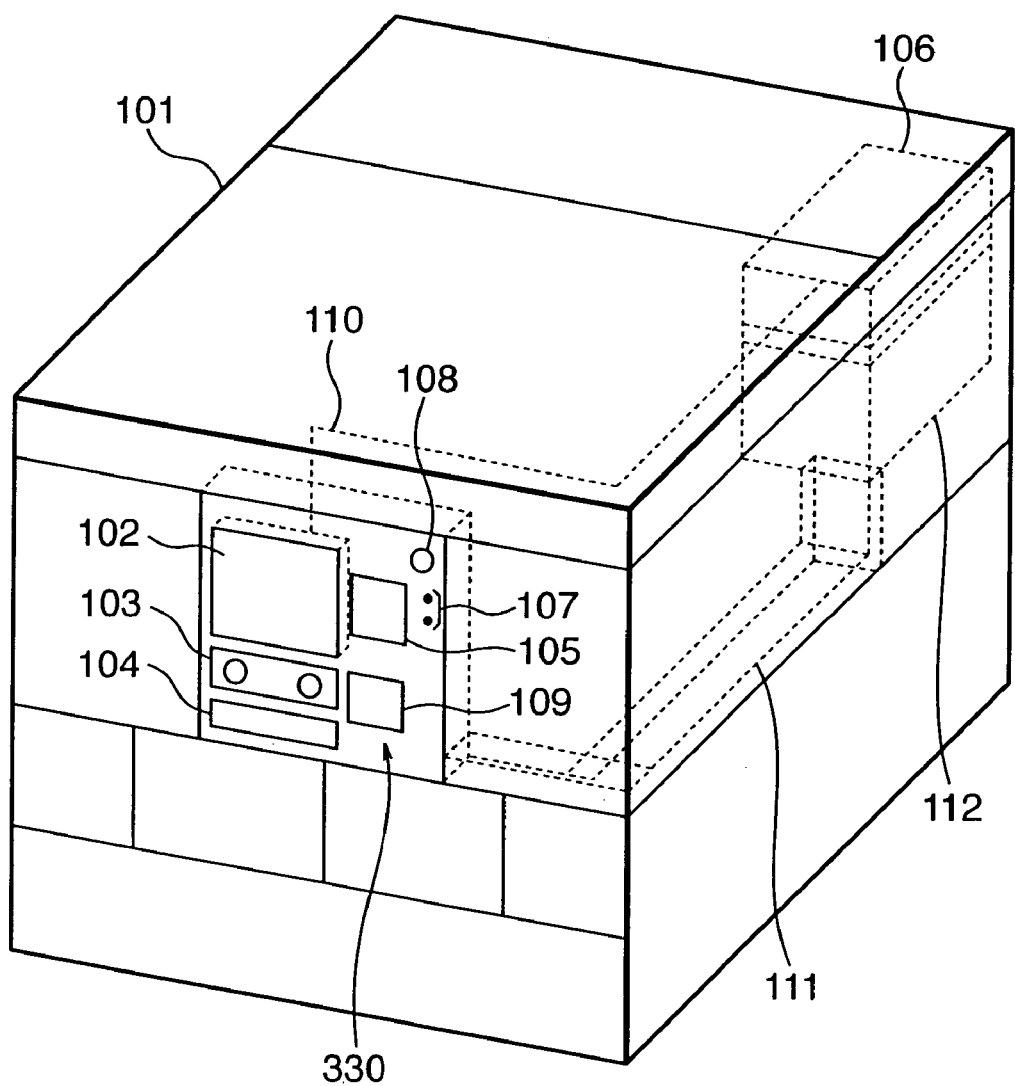
FIG. 1 is a perspective view showing the outer appearance of a semiconductor exposure apparatus according to the first embodiment of the present invention.

FIG. 1 is a perspective view showing the outer appearance of a semiconductor exposure apparatus according to the first embodiment of the present invention. As shown in FIG. 1, the semiconductor exposure apparatus comprises a temperature-controlled chamber 101, which controls the environmental temperature of the apparatus main body, an engineering work station (EWS) main body 106 arranged inside the chamber 101 and having a main body CPU 321 (see FIG. 3), which controls the apparatus main body, and a console unit 330 including an EWS display unit 102, which displays predetermined information of the apparatus, a monitor TV 105, which display image information obtained through an image sensing means in the apparatus main body, an operation panel 103 for inputting predetermined data to the apparatus, an EWS keyboard 104, and the like. Referring to FIG. 1, reference numeral 107 denotes an ON/OFF switch; 108, an emergency stop switch; 109, various switches, a mouse, and the like; 110, a LAN communication cable; 111, an exhaust duct for removing heat from the console unit 330, and 112, an exhaust unit of the chamber. The semiconductor exposure apparatus main body is arranged inside the temperature-controlled chamber 101.

The EWS display unit 102 is a thin flat type one which uses EL, plasma, a liquid crystal, or the like. The EWS display unit 102 is set on the front surface of the temperature-controlled chamber 101 and is connected to the EWS main body 106 through the LAN communication cable 110. The operation panel 103, keyboard 104, monitor TV 105, and the like, are also arranged on the front surface of the temperature-controlled chamber 101 such that the same console operation as in the prior art can be performed on the front surface of the temperature-controlled chamber 101.

Figure 2:
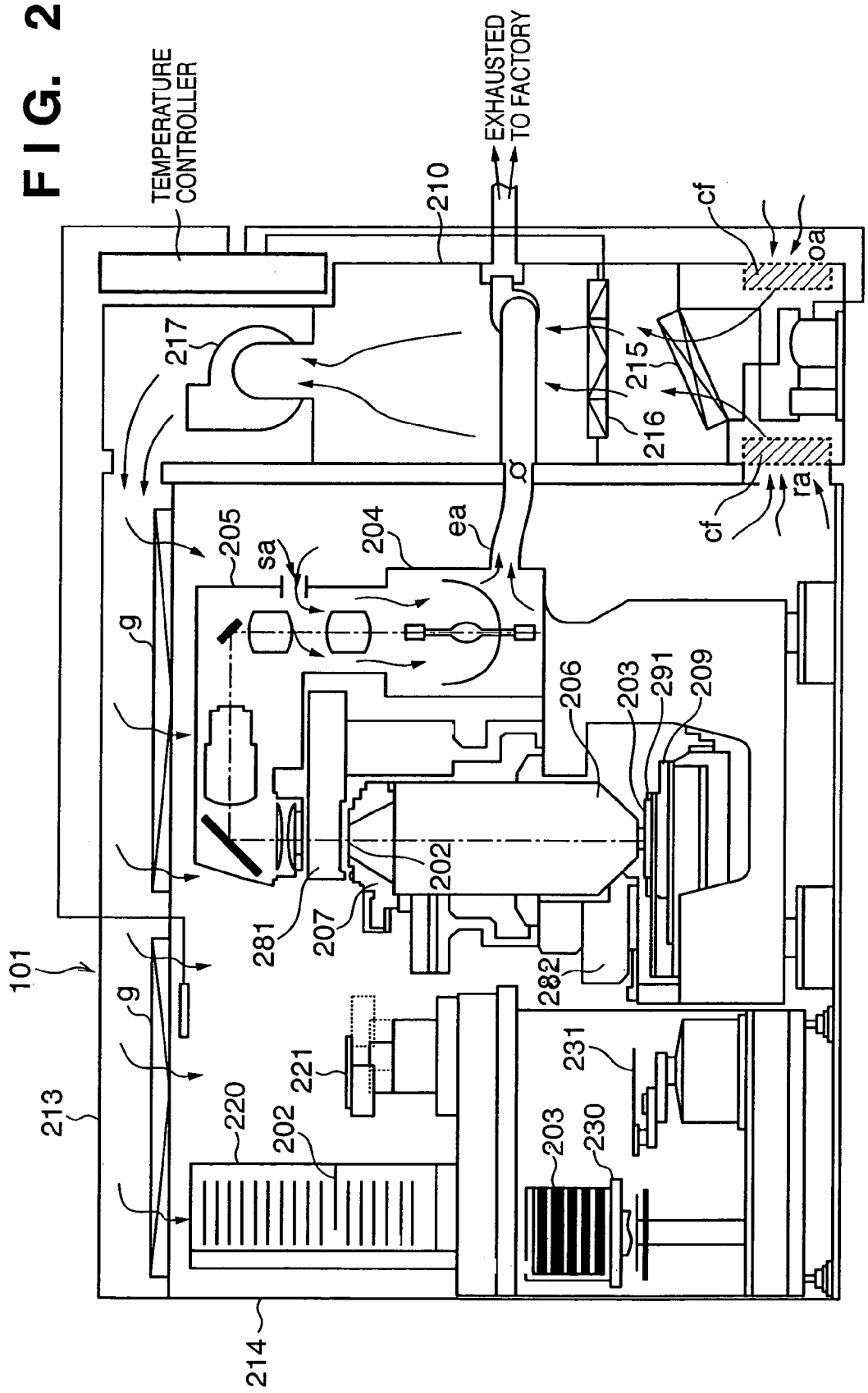
FIG. 2 is a view showing the internal structure of the apparatus of FIG. 1.

FIG. 2 is a view showing the internal structure of the semiconductor exposure apparatus of FIG. 1. FIG. 2 shows a stepper as a semiconductor exposure apparatus. As shown in FIG. 2, when a reticle 202 is illuminated with a light beam from a light source unit 204 through an illumination optical system 205, the pattern on the reticle 202 is transferred onto the photosensitive layer on a wafer 203 through a projection lens 206. The reticle 202 is supported by a reticle stage 207 for holding and moving the reticle 202. The wafer 203 is exposed while being vacuum-chucked by a wafer chuck 291. The wafer chuck 291 can be moved in each axial direction by a wafer stage 209. A reticle optical system 281 for detecting the misalignment amount of the reticle 202 is arranged above the reticle 202. An off-axis microscope 282 is arranged above the wafer stage 209 to be adjacent to the projection lens 206. The off-axis microscope 282 mainly detects the relative positions between internal reference marks and alignment marks on the wafer 203. A reticle library 220 and a wafer carrier elevator 230 as peripheral units are arranged adjacent to the stepper main body. The reticle 202 and wafer 203 are transported into the stepper main body by a reticle transport unit 221 and wafer transport unit 231, respectively, as needed.

The temperature-controlled chamber 101 comprises an air conditioning machine room 210 which mainly adjusts the temperature of air, a filter box 213 which filters fine foreign substances and forms a uniform flow of clean air, and a booth 214 which shields the apparatus environment from the outside. In the temperature-controlled chamber 101, air whose temperature is adjusted by a cooler 215 and re-heater 216 in the air conditioning machine room 210 is supplied into the booth 214 by a fan 217 through an air filter g. The air supplied to the booth 214 returns from a return port ra into the air conditioning machine room 210. Hence, the air circulates in the temperature-controlled chamber 101. Normally, the temperature-controlled chamber 101 does not build a perfect circulation system. To always keep a positive pressure in the booth 214, air outside the booth 214 is introduced from an outside air introduction port oa formed in the air conditioning machine room 210 through the fan in an amount corresponding to about 10% the circulating air amount. In this manner, the temperature adjustment chamber 101 can maintain a predetermined environmental temperature of the apparatus main body and can keep the air clean. The light source unit 204 has a suction port sa and exhaust port ea to cool the ultrahigh-pressure mercury lamp or remove any toxic gas due to abnormality of the laser. Hence, the air in the booth 214 is partially forcibly exhausted to the factory facility via the light source unit 204 through a dedicated exhaust fan of the air conditioning machine room 210. A chemical adsorption filter cf for removing chemical substances in the air is attached to the outside air introduction port oa and return port ra of the air conditioning machine room 210.

Figure 3:
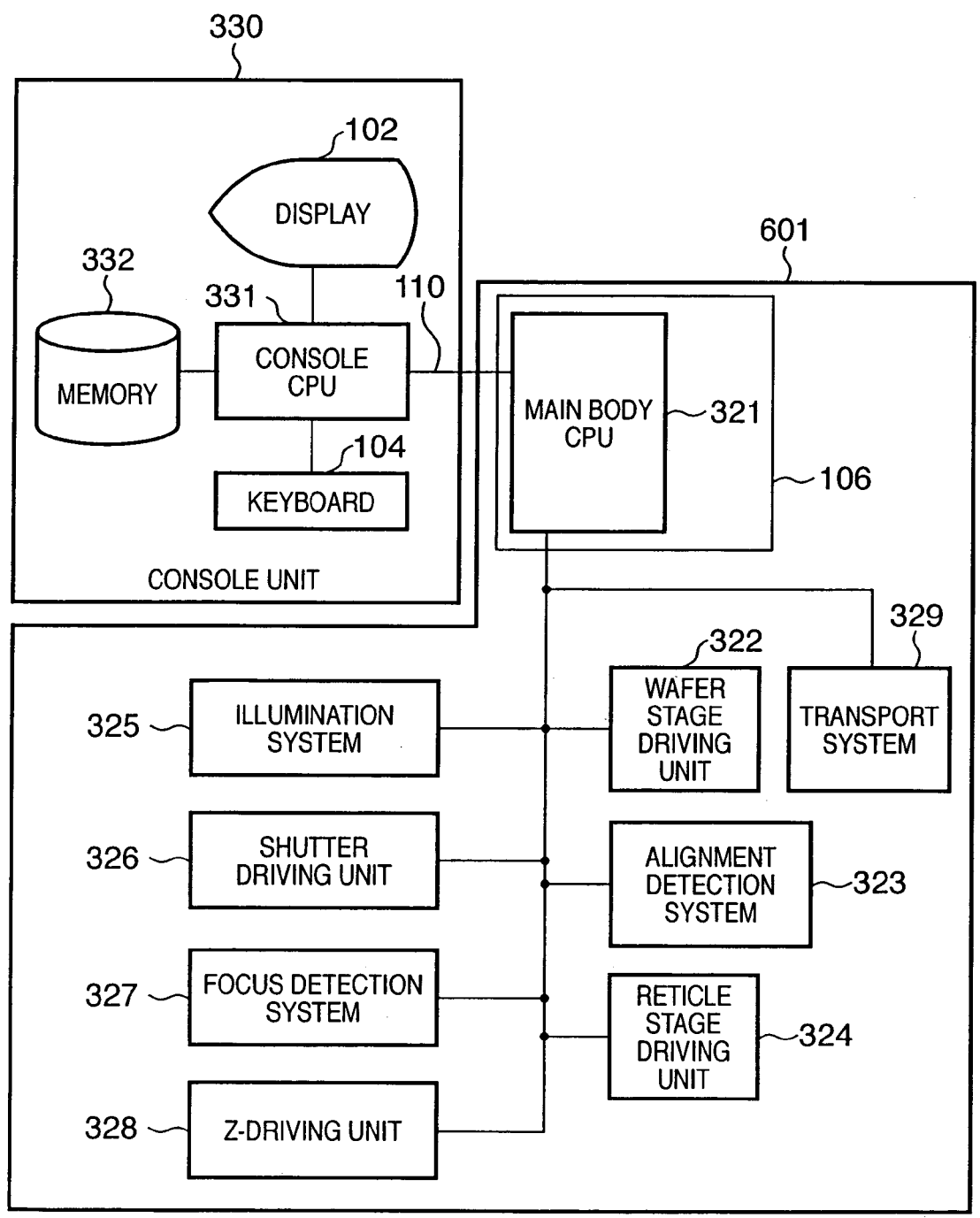
FIG. 3 is a block diagram showing the electrical circuit arrangement of the apparatus of FIG. 1.

FIG. 3 is a block diagram showing the electrical circuit arrangement of the semiconductor exposure apparatus of FIG. 1. Referring to FIG. 3, the main body CPU 321 comprises a central arithmetic unit such as a microcomputer or minicomputer. The main body CPU 321 is incorporated in the EWS main body 106 to control the entire apparatus. More specifically, the main body CPU 321 controls a wafer stage driving unit 322, alignment detection system 323 such as the off-axis microscope 282, reticle stage driving unit 324, illumination system 325 such as the light source unit 204, shutter driving unit 326, focus detection system 327, and Z-driving unit 328. A transport system 329 can be exemplified by the reticle transport unit 221 or wafer transport unit 231.

The console unit 330 comprises the display 102 and keyboard 104 and supplies to the main body CPU 321 various commands or parameters associated with the operation of the semiconductor exposure apparatus. That is, the console unit 330 is used to exchange information with the operator. A console CPU 331 controls the components of the console unit 330. A memory 332 is a storage storing, e.g., a parameter file which has various job parameters. The memory 332 may be arranged in the console unit 330 or may be arranged as an external memory outside the console unit 330. Job parameters include pieces of parameter information such as an alignment method, a focus amount in exposure, an exposure amount, layout data, sample shots for various measurements, and the like.

Figure 4:
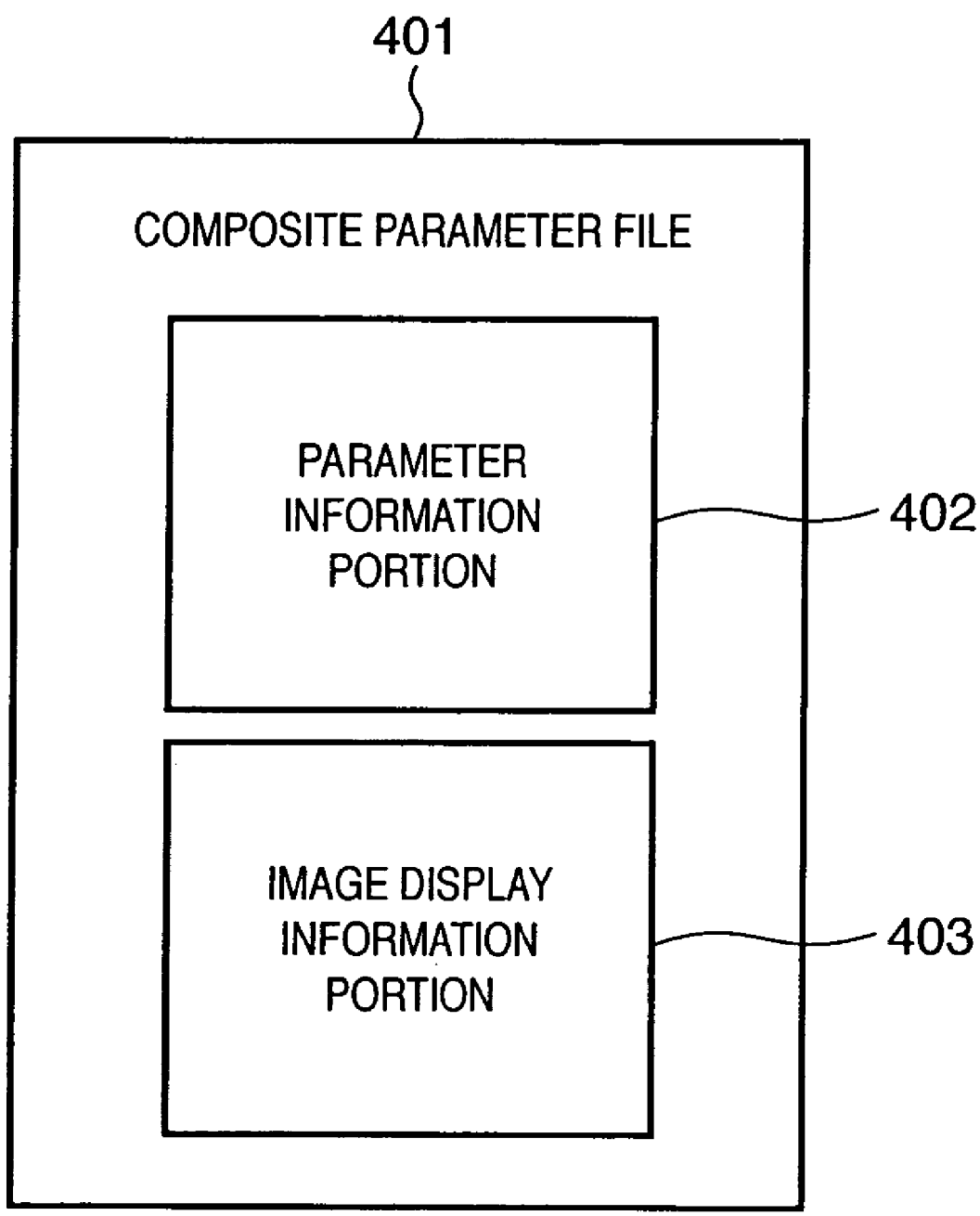
FIG. 4 is a diagram showing an example of a composite parameter file according to the first embodiment.

FIG. 4 is a diagram showing an example of the structure of a composite parameter file according to the present invention. As shown in FIG. 4, a parameter file 401 comprises a parameter information portion 402 which has parameter information for controlling the exposure apparatus and an image display information portion 403 which has image display information for displaying an image in a format adapted to a predetermined image display means on the basis of the parameter information. The parameter information portion 402 has the same contents as those of parameter information in a conventional parameter file. The image display information portion 403 has image display information for displaying an image on a standard viewer such as an SVG (Scalable Vector Graphics) Viewer, a Web browser, which incorporates predetermined plug-ins, or the like. In this embodiment, the parameter file 401 will be referred to as a composite parameter file. Although a case has been exemplified wherein the composite parameter file 401 has the parameter information portion 402 and the image display information portion 403, the present invention is not limited to this. For example, the composite parameter file 401 may not include the parameter information portion 402.

Figure 5:
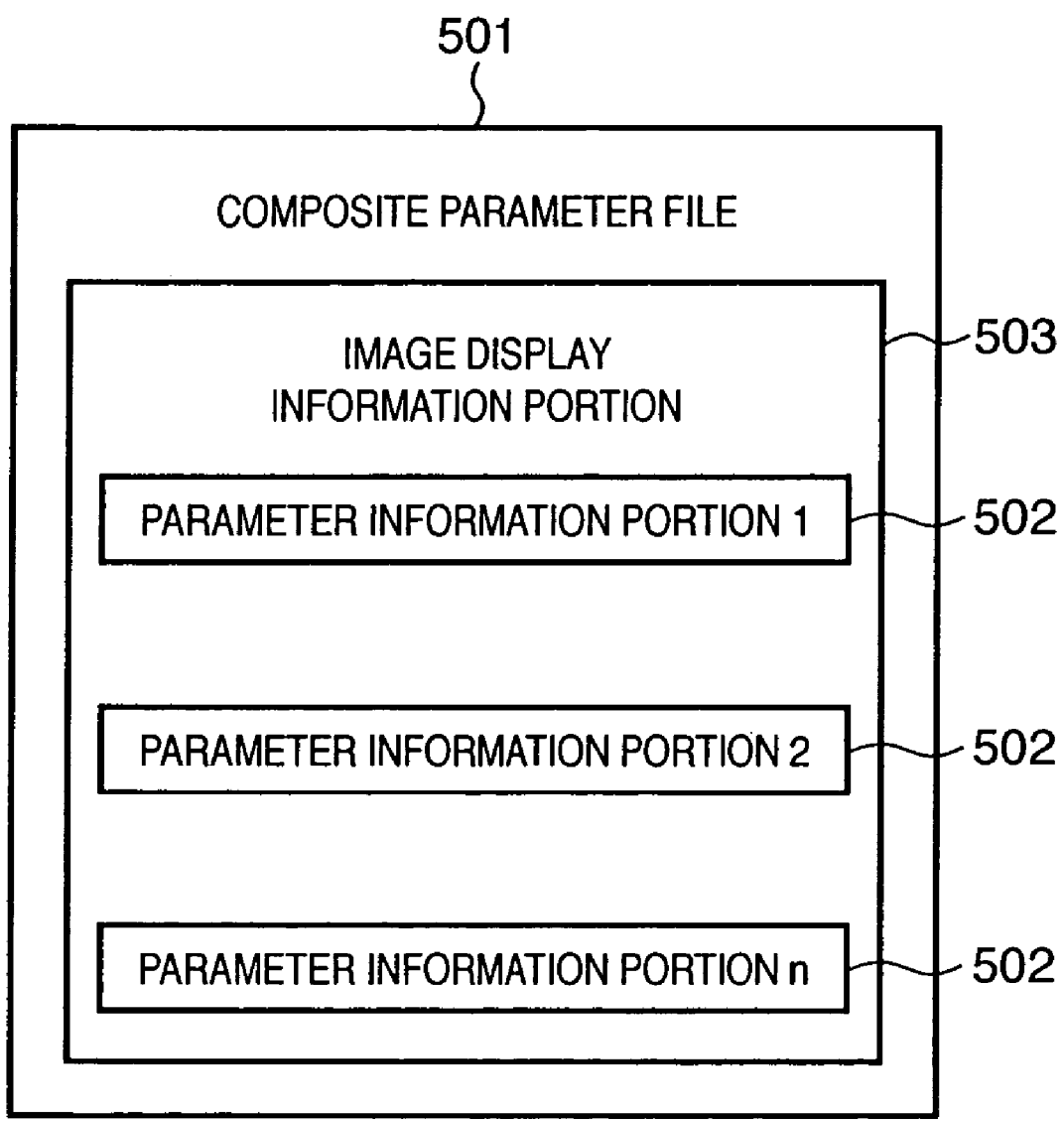
FIG. 5 is a diagram showing an example of the composite parameter file according to the first embodiment.

FIG. 5 is a diagram showing another example of the structure of a composite parameter file 501 according to the present invention. FIG. 5 shows a case wherein parameter information portions 502 are incorporated in an image display information portion 503. The following description of this embodiment will exemplify the use of the composite parameter file 501 shown in FIG. 5. As in the case of FIG. 4, the image display information for displaying an image on a standard viewer such as an SVG viewer, a Web browser, which incorporates predetermined plug-ins, or the like. Each parameter information portion 502 has the same contents as those of parameter information in a conventional parameter file. The parameter information portions 502 are dispersely arranged in the image display information portion 503, as needed.

Figure 6:
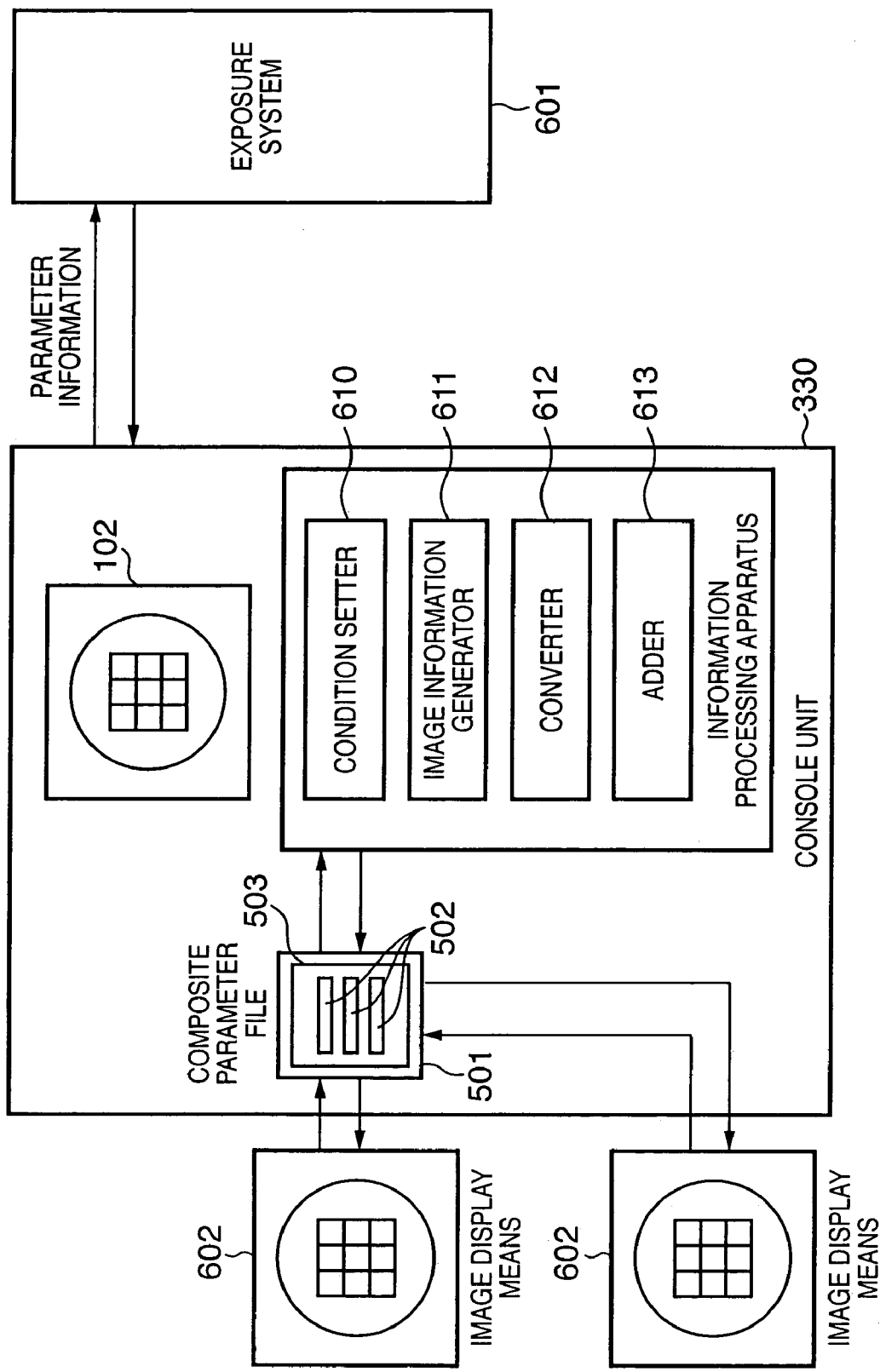
FIG. 6 is a diagram showing an outline of the process of the composite parameter file according to the first embodiment.
Figure 7:
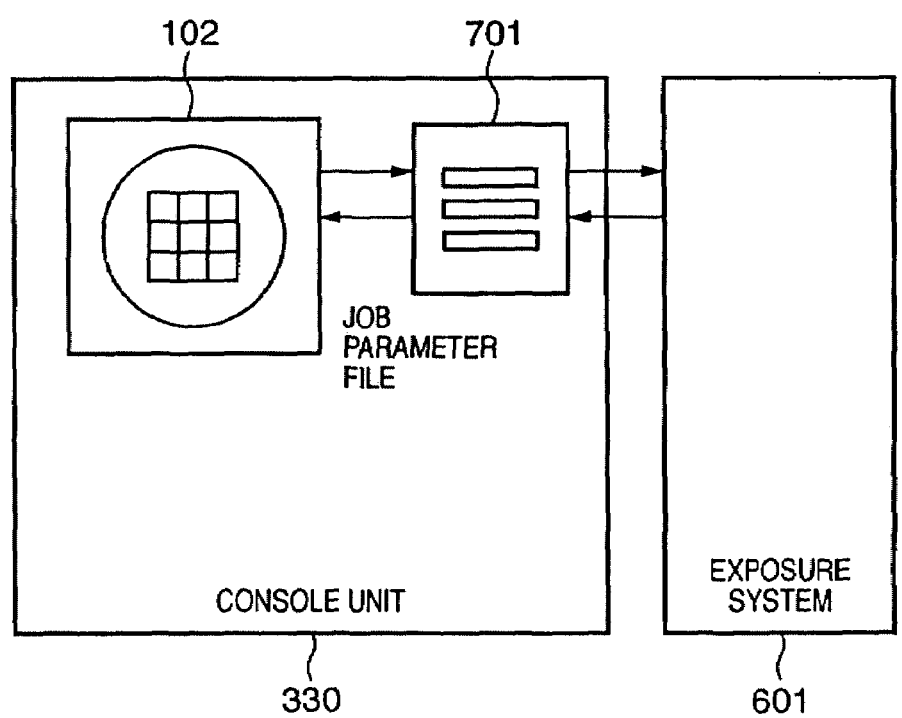
FIG. 7 is a diagram showing an outline of the process of a conventional parameter file.

FIG. 6 is a conceptual view showing an outline of the process flow of the composite parameter file 501. An exposure system 601 includes a semiconductor manufacturing apparatus, an apparatus system such as a job server which manages the job parameter file 701 (see FIG. 7) having job parameters, a system which manages, e.g., job parameters by a Web server, or the like. The console unit 330 can write the composite parameter file 501 using the job parameter file 701 obtained from the exposure system 601 via, e.g., the main body CPU 321. The processing sequence for this is shown in the flow chart of FIG. 8. The console unit 330 can also cause the exposure system 601 to read the composite parameter file 501. The processing sequence is shown in the flow chart of FIG. 9.

Each image display means 602 is an information processing apparatus (e.g., a personal computer) having communication means used for communicating with transmitting/receiving the composite parameter file 501 to/from the exposure system 601, the console unit 330, and/or the like, reads image display information compliant with a prescribed description method displays an image corresponding to the image display information (the composite parameter file 501). In the image display means 602 compliant with the prescribed description method, e.g., Internet Explorer (registered trademark) available from Microsoft (registered trademark) Corporation which incorporates an SVG viewer available from Adobe (registered trademark) Systems Incorporated as a plug-in can be employed. The image display means 602 reads the composite parameter file 501 and displays an image (information to be informed to a user with respect to a control parameter used in the exposure system 601.) In this case, the image is created on the basis of the information in the image display information portion 503 of the composite parameter file 501. Since the information in the parameter information portion 502 is incorporated as comments, descriptions, attributes of the image, and the like, it is not directly displayed as an image.

A case wherein the console unit 330 writes the composite parameter file 501 from the exposure system 601 will be described with reference to the flow chart of FIG. 8. The image display information portion 503 is written in the SVG (Scalable Vector Graphics) format as an XML (Extensible Markup Language) document, and a portion bounded by a pair of tags (e.g., <g> and </g>) is normally considered as one text. However, a text in this embodiment adopts a unit different from that of a normal XML document. Statements written at one time, which correspond to one line in FIGS. 10A and 10B (to be described later), or a statement of one line will be referred to as a test segment. In the following description, image display information includes a test segment which is used for parameter information and whose image is not displayed. Contents and their orders of the image display information portion 503 substantially depend on the values of parameters. To intelligibly explain a process of adding the parameter information portion 502 to the image display information portion 503, job parameters stored in the memory 332 shows in FIG. 3 are read into the memory of the console CPU 331, and a template image display information set serving as a template for creating an image is prepared as follows.

Figure 8:
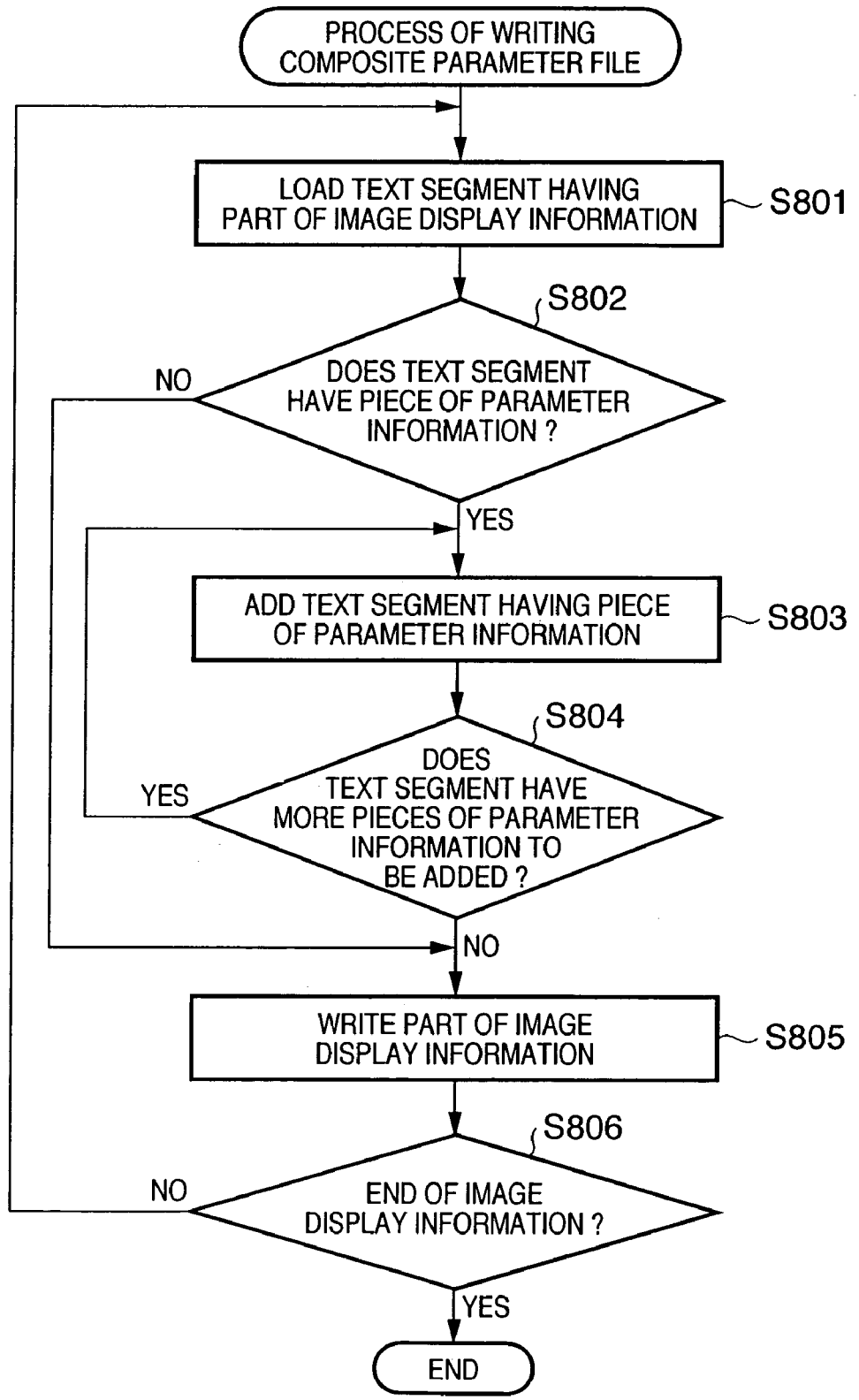
FIG. 8 is a flow chart showing the write operation of the composite parameter file according to the first embodiment.

The parameter information portion 502 is added to the template image display information set by a process shown in the flow chart of FIG. 8. For this purpose, a condition setter 610 (see FIG. 6) of the console unit 330 sets conditions for displaying an image in a format adapted to the image display means 602 on the basis of parameter information from the exposure system 601. An image display information generator 611 of the console unit 330 generates the image display information portion 503 for displaying an image in the above-mentioned format on the basis of the parameter information so as to satisfy the conditions set by the condition setter 610. More specifically, the condition setter 610 increases/decreases number of lines of the text in the image display information portion 503 or makes it possible to write, at a subsequent time, actual numerical values and character strings in variable portions of the text in the image display information portion 503, on the basis of, e.g., the values of parameters (e.g., number of shots, shot size, and position of a shot) in the parameter information. Then, the image display information generator 611 creates the template image display information set as the template for creating an image before the process shown in the flow chart of FIG. 8 and keeps it in the memory of the console CPU 331.

A process of writing the composite parameter file 501 from the exposure system 601 will be described below along the steps of the flow chart of FIG. 8. This process is executed by the console CPU 331 shown in FIG. 3, and the resultant composite parameter file 501 is stored in the memory 332.

Figure 11:
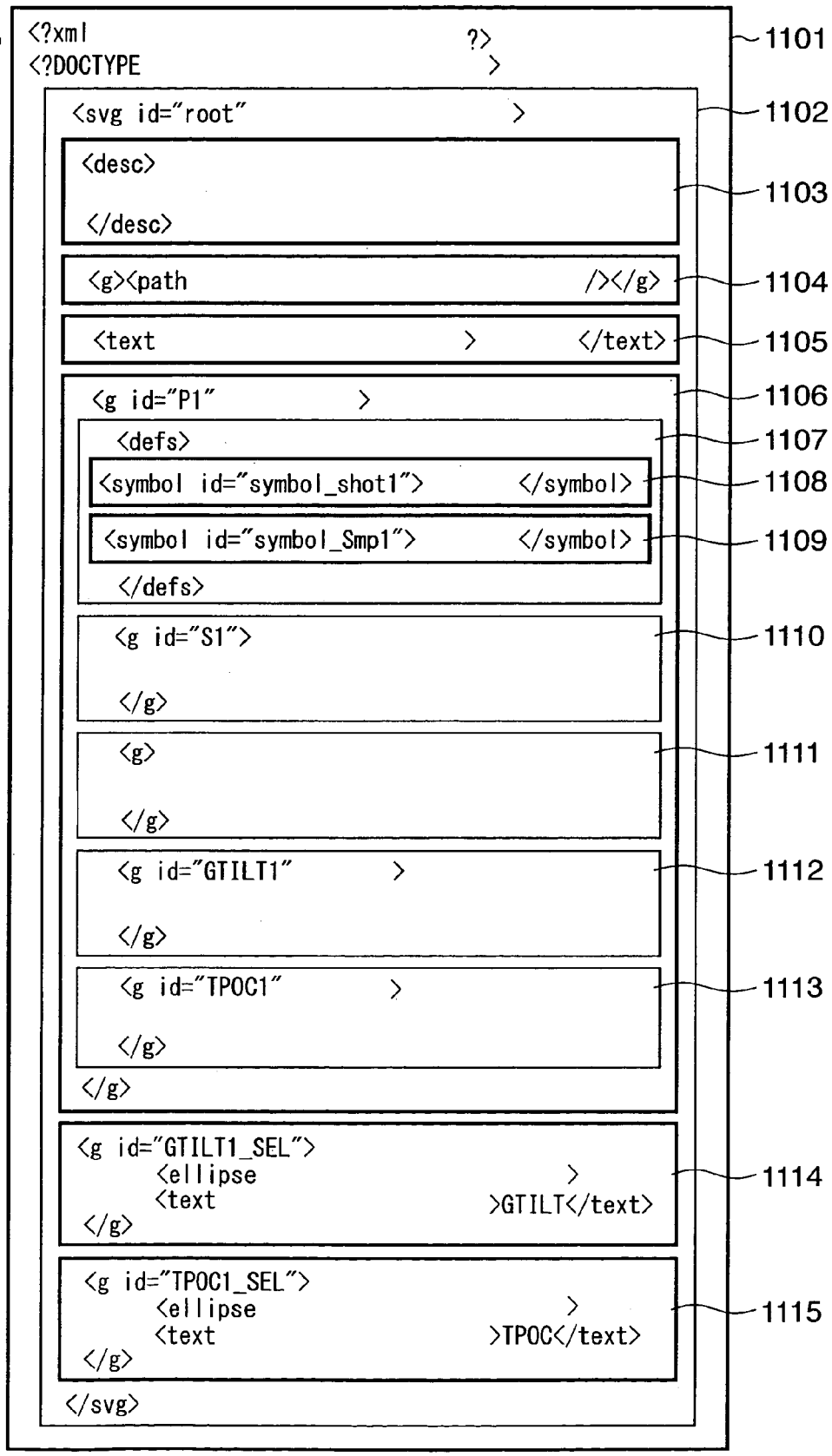
FIG. 11 is a simplified view of the image display information of FIGS. 10A and 10B.

First, in step S801, a text segment including a part of the image display information portion 503 is loaded from the template image display information set stored in the memory 332 into the memory of the console CPU 331. In step S802, it is checked whether the text segment including the part of the image display information portion 503 has a piece of parameter information. In examples of FIGS. 10A, 10B and 11 (to be described later), pieces of parameter information which are not directly related to an image are written in a portion 1103 bounded by tags <desc> and </desc>. A text block 1110 is used to create an image of a shot layout whose id is S1 and which includes an array of exposure shots. Text blocks 1112 and 1113 are used to create images of sample shots for various measurements whose ids are GTILT1 and TPOC1, respectively. If the text segment including the part of the image display information portion 503 has a piece of parameter information, the flow advances to step S803; otherwise, the flow advances to step S805. In step S803, a converter 612 of the console unit 330 converts the piece of parameter information, which is loaded from the text segment into the memory of the console CPU 331, into a format adapted to the image display means 602 on the basis of the job parameters for controlling the exposure apparatus stored in the memory 332. An adder 613 of the console unit 330 adds the parameter information portion 502 obtained by the conversion into the above-mentioned format to the part of the image display information portion 503. The parameter information portion 502 obtained by the conversion may have a tag (e.g., <desc>) indicative of parameter information like the portion 1103 or may have character strings which have a plurality of pairs of a parameter ID and its value such as "PID:data" (neither is shown in the example of FIG. 10A nor 10B) or an attribute (e.g., row="1" and clm="3") such as "1110", "1112", or "1113". The parameter information portion 502 is not limited to a specified format, and any format can be adopted as far as the format complies with the display format of the image display information portion 503 as a source. In step S804, it is checked whether the part of the image display information portion 503 has more pieces of parameter information to be added. If one or more pieces of parameter information remain to be added, the flow returns to step S803; otherwise, the flow advances to step S805. In step S805, the part of the image display information portion 503 is written from the memory 332 into the composite parameter file 501. The part of the image display information portion 503 is prepared in the memory of the console CPU 331, and at this time, it may or may not have parameter statements. When the write operation of the part of the image display information portion 503 ends, the flow advances to step S806. In step S806, it is checked whether the image display information of interest has the final part of the image display information set. In the example of FIG. 11, </svg> in a portion 1102 indicates end of text. If NO in step S806, the flow starts again from the step S801; otherwise, the process ends.

In the above-mentioned manner, the composite parameter file 501 is so created as to include as many parameter information portions 502 as needed for the exposure system 601 and be capable of displaying an image by the image display means 602.

Figure 9:
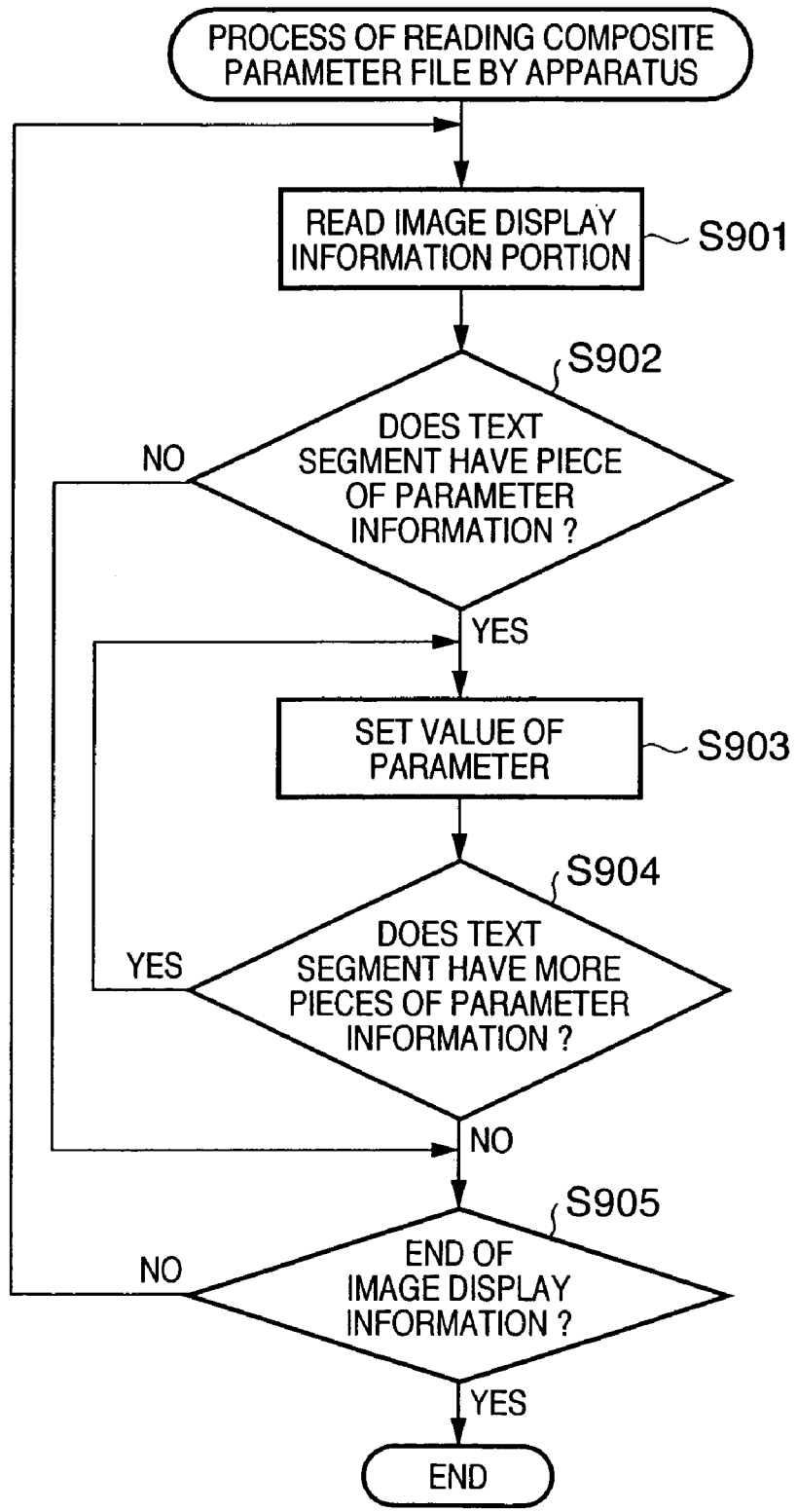
FIG. 9 is a flow chart showing the read operation of the composite parameter file according to the first embodiment.

A case wherein the console unit 330 causes the exposure system 601 to read the composite parameter file 501 will be described with reference to the flow chart of FIG. 9. The image display information portion 503 is written in the SVG format as an XML document, and a portion bounded by a pair of tags (e.g., <g> and </g>) is normally considered as one text. However, a text in this embodiment adopts a unit different from that of a normal XML document. Statements written at a time, which correspond to one line in FIGS. 10A and 10B (to be described later), or a statement of one line will be referred to as a text segment. In the following description, image display information has a text segment which is used for parameter information and whose image is not displayed.

A process of causing the exposure system 601 to read the composite parameter file 501 will be described below along the steps. This process is executed by the console CPU 331, and a resultant parameter file is stored in the memory 332.

First, in step S901, a part of the image display information portion 503 is read from the composite parameter file 501. In step S902, it is checked whether the text segment in the read part of the image display information portion 503 has a piece of parameter information. As described with reference to FIG. 8, a text segment having one or more pieces of parameter information may have a tag (e.g., <desc>) indicative of parameter information like the portion 1103 or may have character strings which have a plurality of pairs of a parameter ID and its value (neither is shown in the example of FIG. 10A nor 10B) or an attribute (e.g., row="1" and clm="3") such as "1110", "1112", or "1113". The text segment is not limited to a specified format, and any format can be adopted as far as the format complies with the display format of source image display information and is known in advance.

If the text segment in the part of the image display information portion 503 has a piece of parameter information, the flow advances to step S903; otherwise, the flow advances to step S905. In step S903, an ID or the like for specifying a parameter and the value of the parameter are extracted from the text segment having the piece of parameter information, and the value is stored at a corresponding address for setting the value of a parameter in the memory of the console CPU 331. Sending the value to the exposure system 601 changes the operation of the exposure system 601. When the value of the parameter is set at the above-mentioned address, the flow advances to step S904. In step S904, it is checked whether the text segment in the read part of the image display information portion 503 has more pieces of parameter information. If one or more pieces of parameter information remain, the flow starts again from step S903; otherwise, the flow advances to step S905. In step S905, it is checked whether the read text segment has the final part of the image display information portion 503. If YES in step S905, the process ends.

In the above-mentioned manner, entire parameter information in the composite parameter file 501 can be loaded into the exposure system 601. If the text segment does not have the final part, the flow starts again from step S901.

Figure 12:
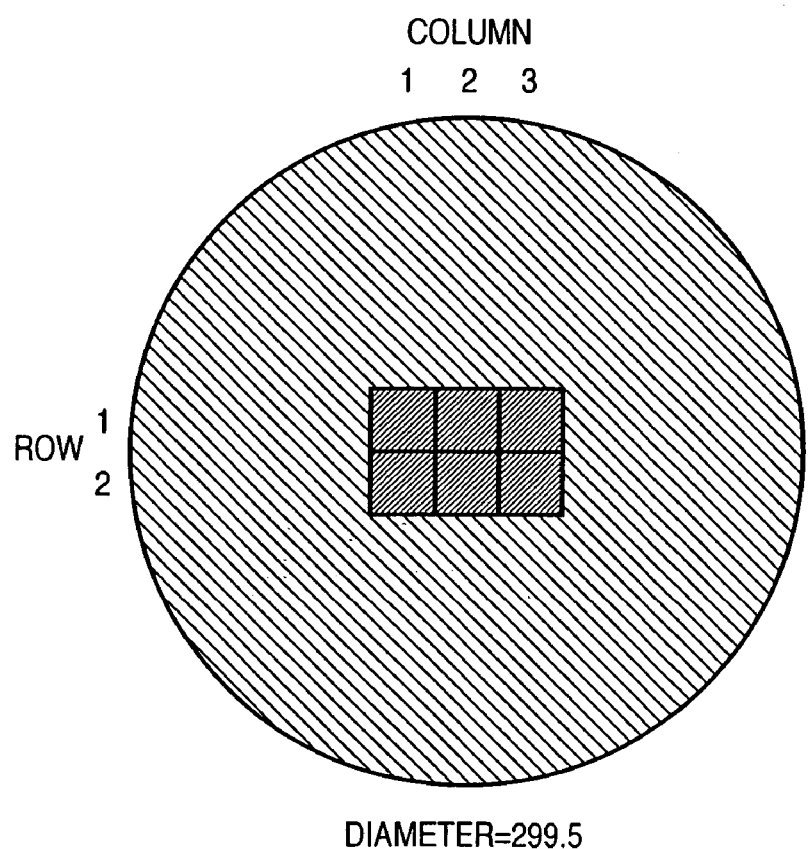
FIG. 12 is a view showing an image displayed on an image display tool using the image display information of FIGS. 10A and 10B.

FIGS. 10A and 10B show examples of the image display information portion 503 (SVG text) to be processed in this embodiment. FIG. 11 is a simplified view of the example of FIGS. 10A and 10B. A brief description will be given with reference to FIG. 11. The description exemplifies a case wherein Internet Explorer (trademark), which incorporates an SVG viewer as a plug-in is employed as the image display means 602. FIG. 12 shows an image which the image display means 602 displays using the SVG text. Referring to FIG. 11, an entire portion 1101 of the SVG test has an XML declaration and a document type declaration. The portion 1102 bounded by tags <svg> and </svg> describes the main body of the image display information portion 503. To distinguish between a name for a parameter and a name for SVG, character strings "job" are defined in the name space of a parameter name. If parameter names and SVG names do not share the same names, name spaces are unnecessary. The portion 1103 bounded by tags <desc> and </desc> is used to explain an SVG file. In this embodiment, a portion bounded by tags <param> and </param> has a general parameter which is not directly related to an image. The parameter ID designed by id and the value of each parameter are included in a portion bounded by tags <param> and </param>. In this example, the first parameter whose parameter id is P1_12345 has a value of 123.45. Although only three parameters are shown here, this portion can actually describe more parameters. A portion 1104 including a tag <path/> is used to create an image of a circular wafer. A portion 1105 is used to display the value of the diameter of the wafer. A portion 1006 is used for a shot layout to be drawn on the wafer and sample shots. A portion 1107 has definitions to be used later. A portion 1108 has a definition used to draw the shot layout; 110, a definition used to draw the sample shots. The portion 110 is used to draw the shot layout. A tag <use/> for drawing each shot has, e.g., the values of job parameters such as a row number, a column number, X- and Y-coordinates, a focus value, and an exposure amount as attributes. A portion 1111 is used to draw "Column", "Row", and their numbers. The portion 1112 is used to draw a sample shot whose id is GTILT. This sample shot is displayed only for one second upon pressing a button GTILT drawn using a portion 1114. The portion 1113 is used to draw a sample shot whose id is TPOC. This sample shot is also displayed only for one second upon pressing a button TPOC drawn using a portion 1115. A tag <use/> used to draw each shot of the portions 1112 and 1113 has the values of the job parameters for a row number and column number as attributes.

The exposure system, which serves as the information processing apparatus of this embodiment, is not limited to have the arrangement of this embodiment. The exposure system may also be applied to a semiconductor manufacturing apparatus, a job server which manages jobs, a Web server which is accessible from, e.g., the Internet, an intranet, or the like. The exposure system can be applied to any apparatus as far as the apparatus manages parameters for controlling an exposure apparatus. In addition, the exposure system may include a console unit. Although in this embodiment, a composite parameter file is stored in a storage of a console unit connected to an exposure system, the present invention is not limited to this. The composite parameter file may be stored in, e.g., an external connectable storage or a removable storage medium. The composite parameter file may be an abstract file formed by collecting related data and may not be stored in a medium. For example, the composite parameter file may be a collection of data to be communicated or may indicate the location of parameters. Although in this embodiment, one SVG file has the entire text, the present invention may use a plurality of files. For example, an HTML file may have the addresses of an SVG file, XML file, and the like. In this embodiment, the process for a composite parameter file has been written as handling a file of character strings. The process may handle DOM (Document Object Model).

With this arrangement, the layout of a job parameter file or an image of a sample shot can easily be viewed with a common standard tool even in a processing apparatus other than an exposure apparatus. This facilitates the handling of a job parameter file.

[Second Embodiment]

The first embodiment enables a processing apparatus other than an exposure apparatus to display the contents of a parameter file as an image. In addition to this, the second embodiment can edit parameters in the parameter file. A method of implementing this will be described as the second embodiment. The second embodiment is different from the first embodiment in a write operation of a composite parameter file and is identical to the first embodiment in a read operation of the composite parameter file. Since a processing method for the read operation is similar to that shown in the flow chart of FIG. 9, a file write process will be described.

Figure 13:
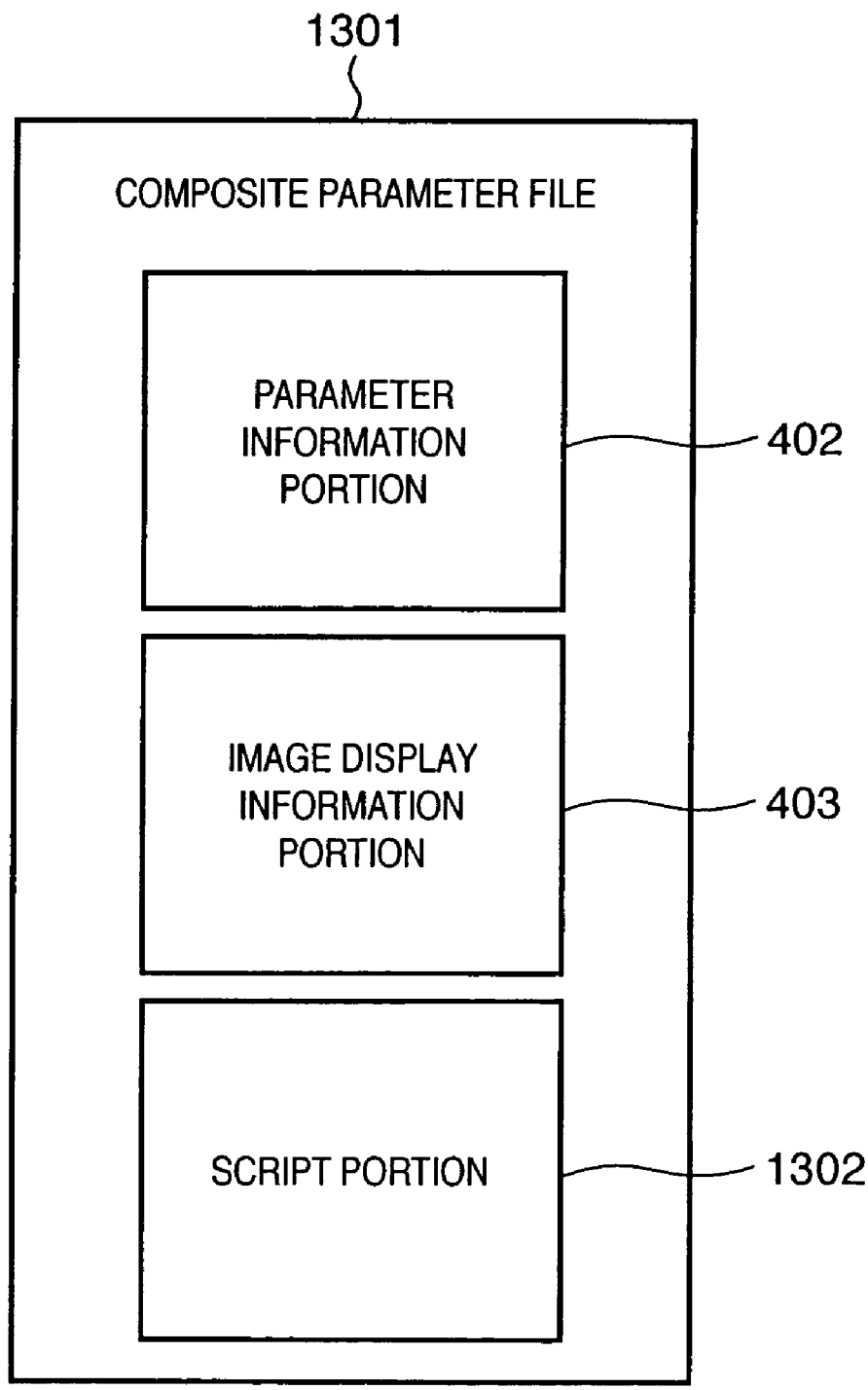
FIG. 13 is a diagram showing an example of a composite parameter file according to the second embodiment.

FIG. 13 is a diagram showing an example of the structure of a composite parameter file according to the present invention. A composite parameter file 1301 includes a script portion 1302 in addition to the contents of the composite parameter file 401 of FIG. 4. A parameter information portion 402 has the same contents as those of parameter information in a conventional parameter file. An image display information portion 403 has image display information for displaying an image on a standard viewer such as an SVG Viewer, a Web browser, which incorporates predetermined plug-ins, or the like. The script portion 1302 has a program for editing the parameter information portion 402 or image display information portion 403. In FIG. 13, a case is exemplified wherein the composite parameter file 1301 is divided into the parameter information portion 402, image display information portion 403, and script portion 1302.

Figure 14:
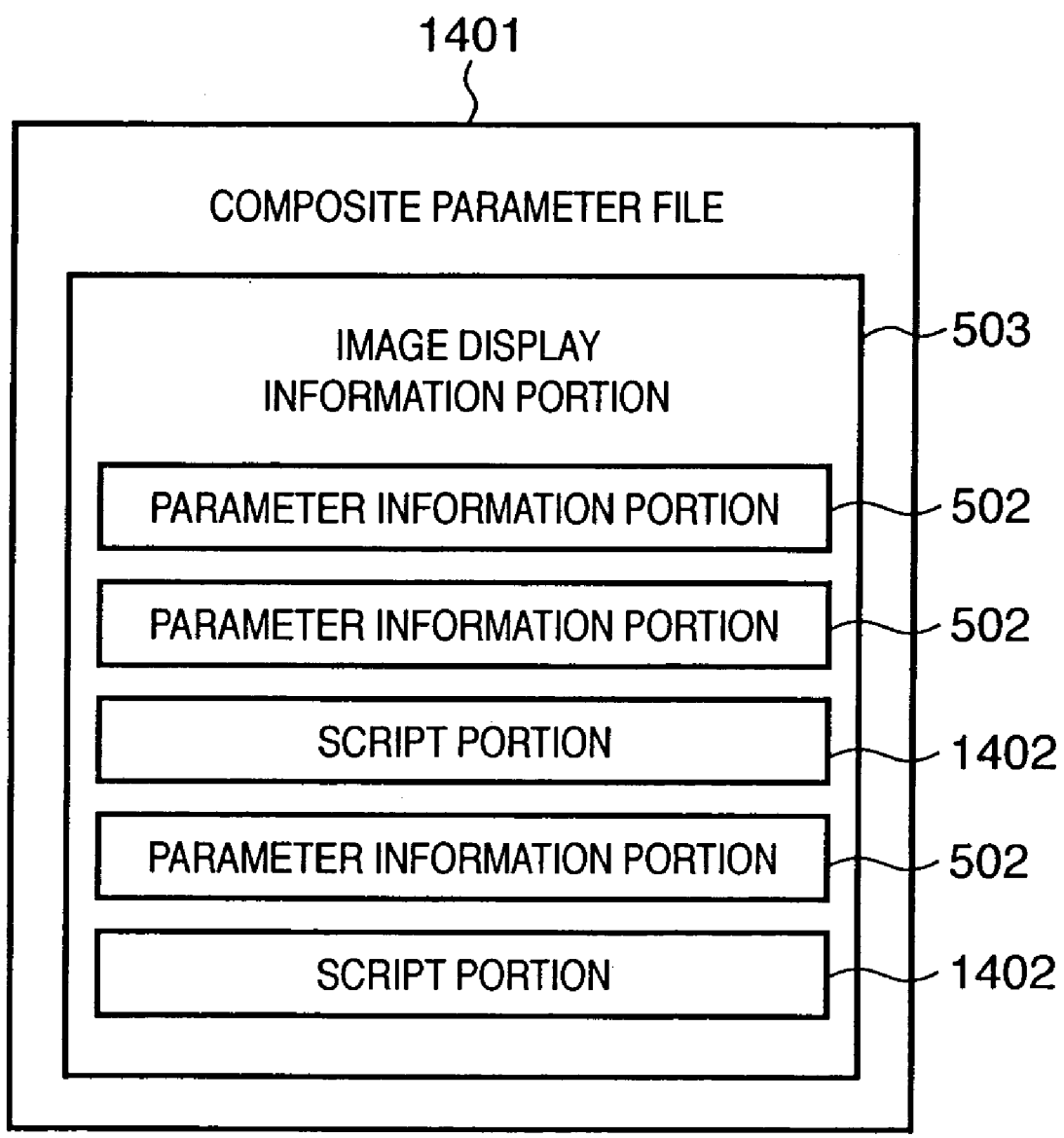
FIG. 14 is a diagram showing an example of a composite parameter file according to the second embodiment.

FIG. 14 is a diagram showing another example of the structure of a composite parameter file 1401 according to the present invention. FIG. 14 shows a case wherein parameter information portions 502 and script portions 1402 are incorporated in an image display information portion 503. The following description of this embodiment will exemplify the use of the composite parameter file 1401 shown in FIG. 14. The image display information portion 503 has image display information for creating an image on a standard viewer such as an SVG viewer, or the like. Each parameter information portion 502 has the same contents as those of parameter information in a conventional parameter file. The script portion 1402 has a program for editing the parameter information portions 502 and image display information portion 503. The parameter information portions 502, each of which has the same contents as those of parameter information in a conventional parameter file, are dispersely arranged in the image display information portion 403, as needed. The composite parameter file 1401 is arranged in the image display information portion 503 so as to include the parameter information portions 502 and script portions 1402.

Figure 15:
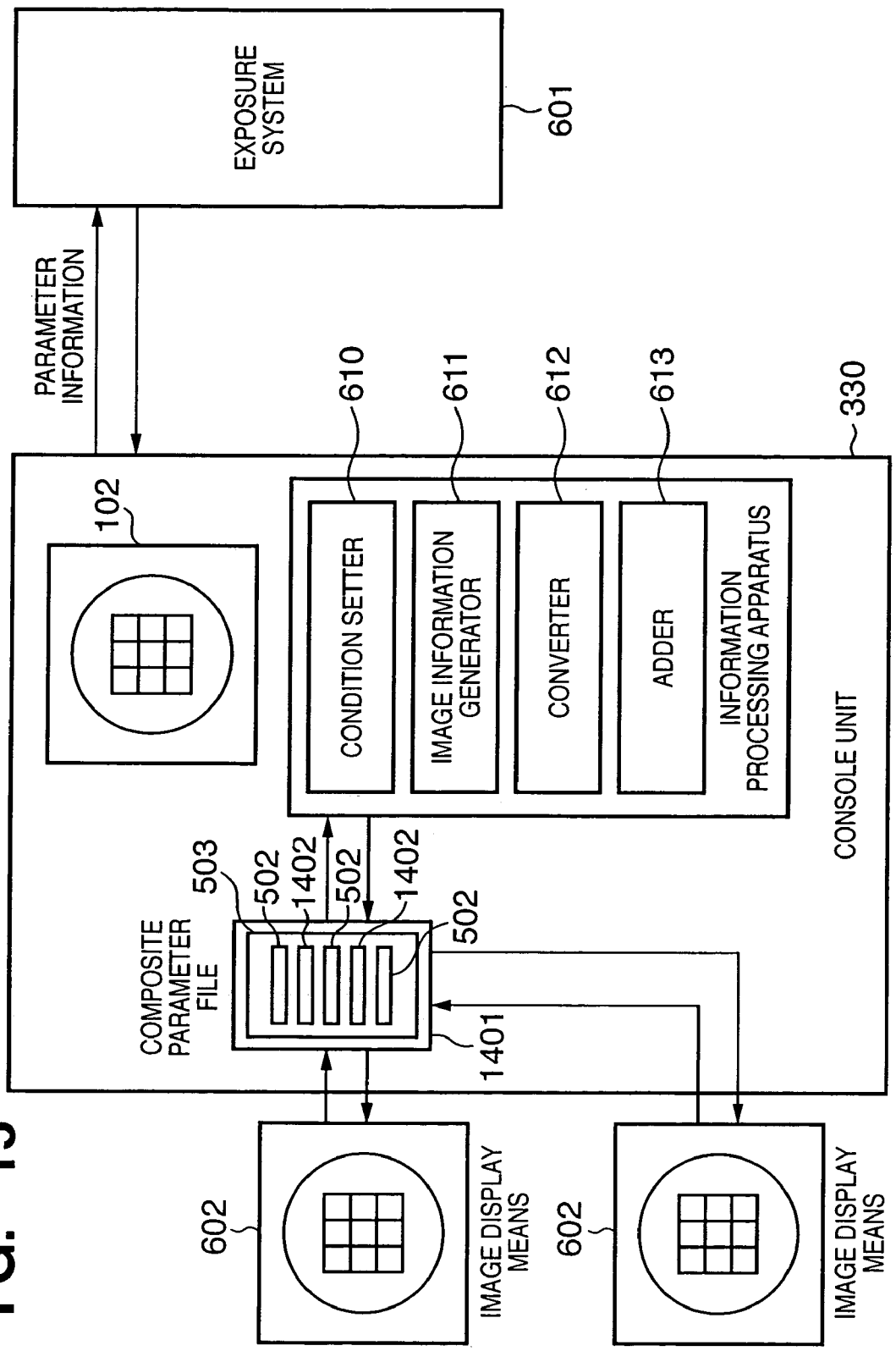
FIG. 15 is a diagram showing an outline of the process of the composite parameter file according to the second embodiment.

FIG. 15 is a conceptual view showing an outline of the process flow of the composite parameter file 1401. An exposure system 601 includes a semiconductor manufacturing apparatus, an apparatus system such as a job server which manages the composite parameter file 1401 including job parameters, a system which manages, e.g., job parameters by a Web server, or the like. A console unit 330 can write the composite parameter file 1401 from the exposure system 601. The processing sequence for this is shown in the flow chart of FIG. 16. The console unit 330 can also cause the exposure system 601 to read the composite parameter file 1401, and its processing sequence is shown in the flow chart of FIG. 9. Image display means 602 each reads the image display information portion 503 compliant with a prescribed description method and displays an image corresponding to a text in the image display information. The image display means 602 can execute a program in the script portion 1402 to implement functions of a parameter editor. That is, the image display means 602 can modify the composite parameter file 1401 or image display information portion 503 through the operator's operation or the like. As for a simple parameter which is not directly related to an image, such as one arranged in a portion 1803 (to be described later), the parameter name and value are displayed, and the value can be changed. This change requires basically the same arrangement as that required to edit parameters to be displayed as an image (to be described later), and a description thereof will be omitted. As the image display means 602, e.g., Internet Explorer (trademark) available from Microsoft Corporation, which incorporates an SVG viewer available from Adobe Systems Incorporated as a plug-in can be employed. The image display means 602 reads the composite parameter file 1401 and displays an image. In this case, the image is created on the basis of the information in the image display information portion 503 of the composite parameter file 1401. Since the information in the parameter information portion 502 or script portion 1402 is incorporated as comments, descriptions, attributes of the image, and the like, it is not directly displayed as an image.

Figure 16:
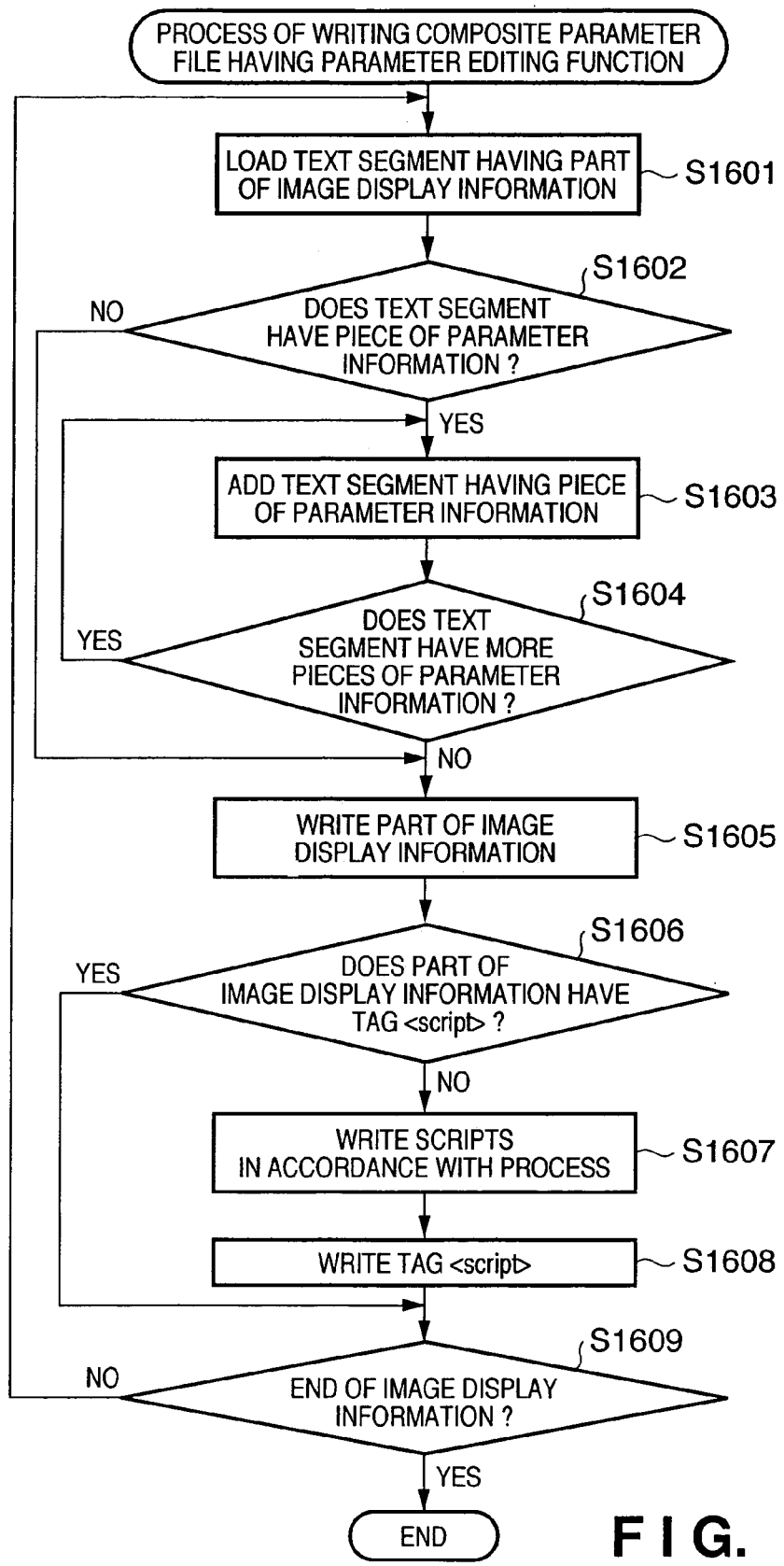
FIG. 16 is a flow chart showing the write operation of the composite parameter file according to the second embodiment.

A case wherein the console unit 330 writes the composite parameter file 1401 from the exposure system 601 will be described with reference to the flow chart of FIG. 16. The image display information portion 503 is written in the SVG format as an XML document, and a portion bounded by a pair of tags (e.g., <g> and </g>) is normally considered as one text. However, a text in this embodiment adopts a unit different from that of a normal XML document. Statements written at a time, which correspond to one line in FIGS. 17A and 17B (to be described later), or a statement of one line will be referred to as a text segment. In the following description, image display information has a text segment which is used for parameter information and whose image is not displayed. Contents and their orders of the image display information substantially depend on the values of parameters. To intelligibly explain a process of adding the parameter information portion 502 or script portion 1402 to the image display information portion 503, job parameters stored in a memory 332 are read into the memory of a console CPU 331, and a template image display information set serving as a template for creating an image is prepared as follows. The parameter information portion 502 or script portion 1402 is added to the template image display information set by a process shown in the flow chart of FIG. 16. For this purpose, a condition setter 610 of the console unit 330 sets conditions for displaying an image in a format adapted to the image display means 602 on the basis of parameter information from the exposure system 601. An image display information generator 611 of the console unit 330 generates the image display information portion 503 for displaying an image in the above-mentioned format on the basis of the parameter information so as to satisfy the conditions set by the condition setter 610. More specifically, in the image display information portion 503 for displaying an image, the condition setter 610 increases/decreases the number of lines of a text or makes it possible to write, at a subsequent time, actual numerical values and character strings in variable portions of the text, on the basis of, e.g., the values of parameters (e.g., number of shots, shot size, and position of a shot) in the parameter information. Then, the image display information generator 611 creates the image display information set as the template for creating an image before the process shown in the flow chart of FIG. 16 and keeps it in the memory of the console CPU 331. The script portion 1402 to be added to the image display information portion 503 is prepared in the memory of the console CPU 331 in accordance with the parameters like the above-mentioned template. A process of writing the composite parameter file 1401 from the exposure system 601 will be described below along the steps of the flow chart of FIG. 16.

This process is executed by the console CPU 331, and a resultant parameter file is stored in the memory 332.

The write operation of a composite parameter file having a parameter editing function will be described with reference to the flow chart of FIG. 16. The first half steps S1601 to S1604 are the same as the steps S801 to S804 in FIG. 9.

Figure 18:
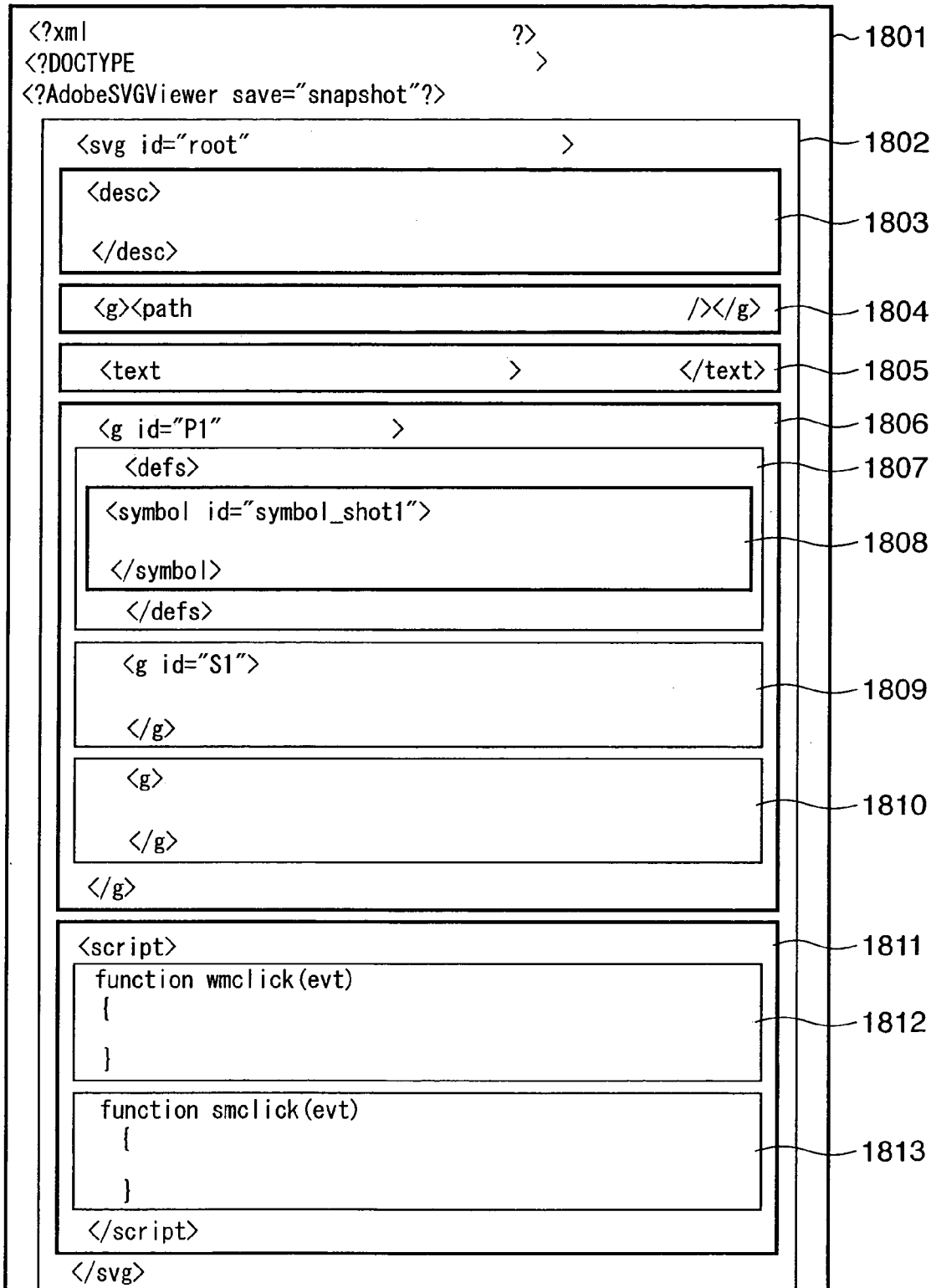
FIG. 18 is a simplified view of the image display information (SVG (scalable vector graphics) text) of FIGS. 17A and 17B.

First, in step S1601, a part of the image display information portion 503 is loaded from the template image display information set stored in the memory 332 into the memory of the console CPU 331. In step S1602, it is checked whether the text segment in the part of the image display information portion 503 has a piece of parameter information. In examples of FIGS. 17A, 17B and 18 (to be described later), parameters which are not directly related to an image are written in the portion 1803 bounded by tags > and </desc>. A text block 1809 is used to create an image of a shot layout whose id is S1 and which includes an array of exposure shots. If the text segment in the part has a piece of parameter information, the flow advances to step S1603; otherwise, the flow advances to step S1605. In step S1603, a converter 612 of the console unit 330 converts the piece of parameter information, which is loaded from the text segment into the memory of the console CPU 33, into a format adapted to the image display means 602 on the basis of the job parameters for controlling the exposure apparatus stored in the memory 332. An adder 613 of the console unit 330 adds the parameter information portion 502 obtained by the conversion into the above-mentioned format to the part of the image display information portion 503. The parameter information portion 502 obtained by the conversion may have a tag indicative of parameter information like the portion 1803 or may have character strings which have a plurality of pairs of a parameter ID and its value such as "PID:data" (neither is shown in the example of FIG. 17A or 17B) or an attribute (e.g., row="2" and clm="1") such as "1809". The parameter information portion 502 is not limited to a specified format, and any format can be adopted as far as the format complies with the display format of source image display information. In step S1604, it is checked whether the part of the image display information portion 503 has more pieces of parameter information to be added. If one or more pieces of parameter information remain to be added, the flow returns to step S1603; otherwise, the flow advances to step S1605. In step S1605, the part of the image display information portion 503 is written. The part of the image display information portion 503 is prepared in the memory of the console CPU 331, and at this time, it may or may not have parameter statements. When the write operation of the part of the image display information portion 503 ends, the flow advances to step S1606. In step S1606, it is checked whether the part of the image display information portion 503 written in step S1606 has a tag <script> indicative of a script area. If the part does not have a <script> tag, the flow advances to step S1609; otherwise, the flow advances to step S1607. In step S1607, predetermined scripts prepared in the memory of the console CPU 331 are written. Then 1 in step S1608, a tag </script> which indicates the end of the scripts is written. The flow advances to step S1609. In step S1609, it is checked whether the image display information of interest has the final part of the image display information set. In the example of FIG. 18, </svg> in a portion 1802 indicates the end of text. If YES in step S1609, the process ends; otherwise, the flow starts again from the step S1601. In this manner, the composite parameter file 1401 is so created as to include as many pieces of parameter information as needed for the exposure system 601 and be capable of displaying an image by the image display means 602.

FIGS. 17A and 17B show examples of image display information (SVG text) to be processed in this embodiment. FIG. 18 is a simplified view of the examples of FIGS. 17A and 17B. A brief description will be given with reference to FIG. 18. the description exemplifies a case wherein Internet Explorer (registered trademark), which incorporates an SVG viewer as a plug-in is employed as the image display means 602. An image which the image display means 602 displays using the SVG text corresponds to an image obtained by removing the buttons GTILT and TPOC from the image in FIG. 12. An entire portion 1801 of the SVG text includes an XML declaration and a document type declaration. A portion <?AdobeSVGViewer save="snapshot"?>" makes it possible to save the image display information portion 503, whose contents are changed by an editor function of this embodiment, at the time of execution of a command "Save SVG As . . . " which is displayed by right-clicking on the displayed image.

The portion 1802 bounded by tags <svg> and </svg> describes the main body of the image display information portion 503. To distinguish between a name for a parameter and a name for SVG, character strings "job" are defined in the name space of a parameter name. If parameter names and SVG names do not share the same names, name spaces are unnecessary. The portion 1803 bounded by tags <desc> and </desc> is used to explain an SVG file. In this embodiment, a portion bounded by tags <param> and </param> has a general parameter which is not directly related to an image. The parameter ID designated by id and the value of each parameter are included in a portion bounded by tags <param> and </param>. In this example, the first parameter whose parameter id is P1_12345 has a value of 123.45. Although only three parameters are shown here, this portion actually describes more parameters. A portion 1804 including a tag <path/> is used to create an image of a circular wafer. A portion 1805 is used to display the value of the diameter of the wafer. A portion 1806 is used for a shot layout to be drawn on the wafer. A portion 1807 has definitions to be used later; a portion 1808, a definition used to draw the shot layout. A portion 1809 is used to draw the shot layout. A tag <use/> for drawing each shot has, e.g., the values of job parameters such as a row number, a column number, X- and Y-coordinates, a focus value, and an exposure amount as attributes. A portion 1810 is used to draw "Column", "Row", and their numbers. A portion 1811 describes scripts including a portion bounded by tags <script> and </script>. A portion 1812 describes a script for adding a shot at a clicked portion of an image of the circular wafer. A portion 1813 describes a script for removing a rectangle shot upon clicking the shot.

The exposure system, which serves as the information processing apparatus of this embodiment, is not limited to have the arrangement of this embodiment, as described in the preceding paragraph. The exposure system may also be applied to a semiconductor manufacturing apparatus, a job server which manages jobs, a Web server which is accessible from, e.g, the Internet, an intranet, or the like. The exposure system can be applied to any apparatus as far as the apparatus manages parameters for controlling an exposure apparatus. If the information processing apparatus according to this embodiment is applied to a Web server, it can save a composite parameter file to the Web server and read it from the Web server through a network (e.g., by specifying the address of the Web server. The save operation of the parameter file involves sending and saving it to the Web server. This differs from the examples of FIGS. 17A and 17B. To send the parameter file to the Web server, an image of a button Save is created, and the following script is written as an event process which is executed upon pressing the button:

var text=printNode (svgDocument);
    post URL(("URL (Uniform Resource Locator) about the Web server," text, cb);

where cb represents a callback routine for receiving a status as a result of sending a composite parameter file to the Web server. The Web server may receive the sent composite parameter file using a CGI (Common Gateway Interface) program (e.g., svgsave.cgi) and execute the save operation. In addition, the exposure system may include a console unit.

Although, in this embodiment, a composite parameter file is stored in a storage console unit connected to an apparatus or system, the present invention is not limited to this. The composite parameter file may be stored in, e.g., an external connectable storage or a removable storage medium. The composite parameter file may be an abstract file formed by collecting related data and may not be stored in a medium. For example, the composite parameter file may be a collection of data to be communicated or may indicate the location of parameters. Although, in this embodiment, one SVG file includes the entire text, the present invention may use a plurality of files. For example, an HTML file may have the addresses of an SVG file, XML file, and the like. A script included in a program for editing the parameter information portion 402 or image display information portion 403 can be written using Java Script (registered trademark) (ECMA (European Computer Manufacturer's Association) Script), or the like. The present invention, however, is not limited to this. For example, a program language such as Java (registered trademark), C#, or the like may be employed in accordance with the image display means 602. Scripts or programs are not limited to character strings easily understandable to the users. For example, scripts or programs may be encoded, compiled, converted into an intermediate language, or compressed.

With this arrangement, the layout of a job parameter file or an image of a sample shot can easily be viewed with a common standard tool in a piece of equipment other than an apparatus. Parameters can be modified regardless whether they are related to an image. This facilitates the handling of job parameters.

[Third Embodiment]

The second embodiment makes it possible to edit parameters in a parameter file. The editing operation may also be performed by voice. A method of implementing this will be described as the third embodiment. The third embodiment is identical to the first embodiment in a read operation of a composite parameter file, and a processing method for the read operation is similar to that shown in the flow chart of FIG. 9. The third embodiment is different from the second embodiment in a write operation of a composite parameter file, and its flow is slightly different from that shown in the flow chart of FIG. 16. The flow of the third embodiment is obtained by replacing a part of the description of step S1601 "a part of image display information is loaded from the template image display information set into the memory of the console CPU 331" with "a part of image display information is loaded from the template image display information set which has a text segment written in a voice-capable description language into the memory of the console CPU 331 by voice response operation of a parameter editing function." Similar to the second embodiment, the number of lines of a text for displaying an image, which has a text segment written in a voice-capable description language, is increased/decreased on the basis of the values of parameters (e.g., the number of shots), or the text is arranged to write, at a subsequent time, actual numerical values and character strings in its variable portions on the basis of the values of parameters (e.g., shot size and position of a shot). With this operation, the template image display information set is prepared in advance so as to serve as a template for creating an image operable by voice and have a text segment written in a voice-capable description language (e.g., Voice XML (trademark)).

Figure 19:
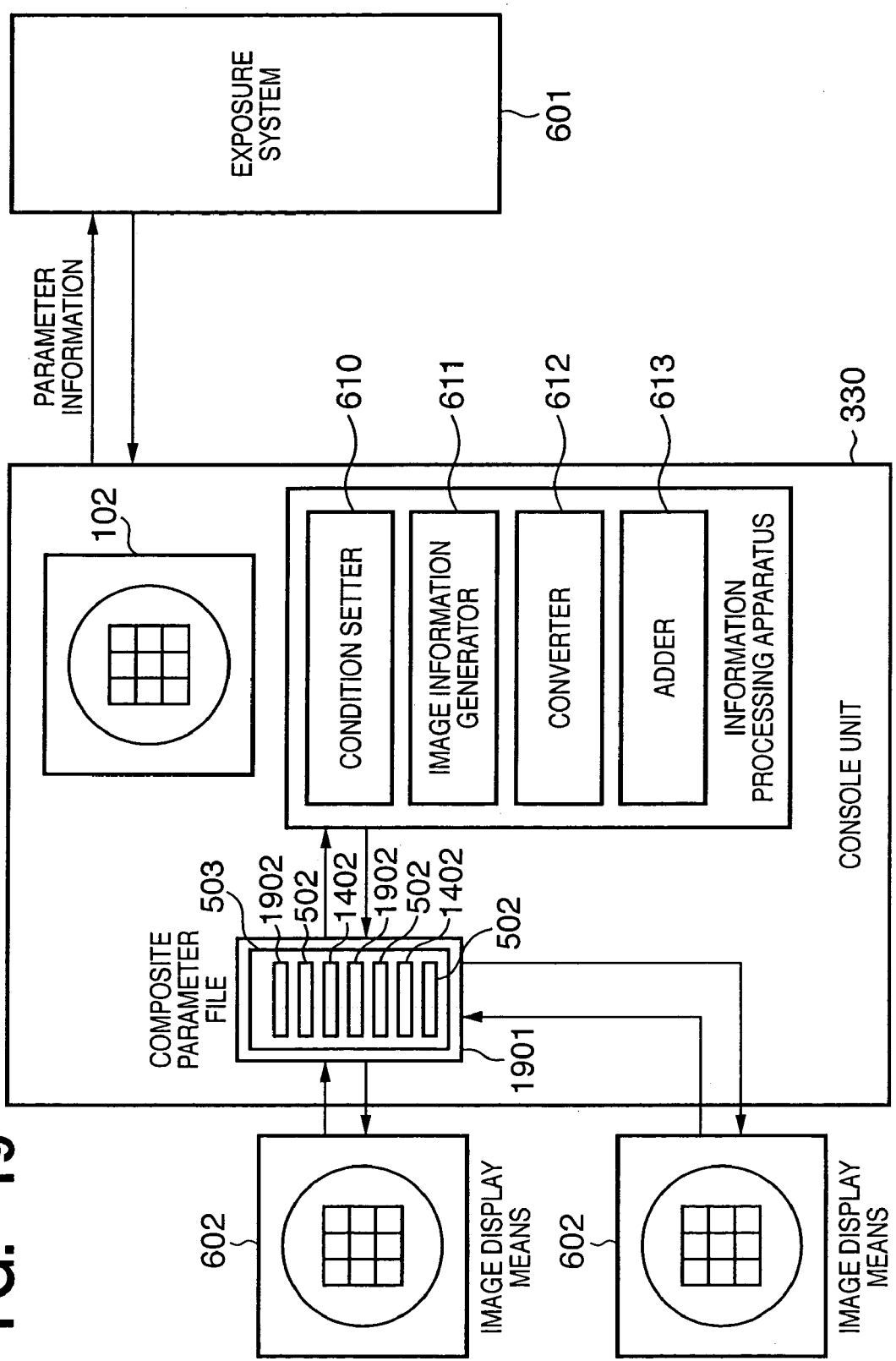
FIG. 19 is a diagram showing an outline of the process of a composite parameter file according to the third embodiment.

FIG. 19 is a conceptual view showing an outline of the process flow of a composite parameter file 1901. An exposure system 601 includes a semiconductor manufacturing apparatus, an apparatus system such as a job server which manages the composite parameter file 1901 having job parameters, a system which manages, e.g., job parameters by a Web server, or the like. A console unit 330 can write the composite parameter file 1901 from the exposure system 601. The processing sequence for this is obtained by slightly modifying the flow chart of FIG. 16. The console unit 330 can also cause the exposure system 601 to read the composite parameter file 1901, and its processing sequence is shown in the flow chart of FIG. 9 (partial modification is necessary). Image display means 602 each reads an image display information portion 503 compliant with a prescribed description method and displays an image corresponding to the image display information portion 503. The image display means 602 can execute a program in the script portion 1402 to implement functions of a parameter editor. That is, the image display means 602 can modify the parameter information portion 502 or image display information portion 503, through a mouse operation a touch panel operation, a keyboard operation, a voice operation in accordance with a voice response description portion 1902, or the like, of the operator. As the image display means 602, e.g., Internet Explorer (trademark) available from Microsoft Corporation which incorporates SVG viewer available from Adobe Systems Incorporated as a plug-in can be employed. The image display means 602 reads the composite parameter file 1901 and displays an image. In this case, the image is created on the basis of the information in the image display information portion 503 of the composite parameter file 1901. Since the information in the parameter information portion 502 is incorporated as comments, descriptions, attributes of the image, and the like, it is not directly displayed as an image. Also, the information in the script portion 1402 or voice response description portion 1902 is not directly displayed as an image. A process of writing the composite parameter file 1901 from the exposure system 601 is the same as that shown in the flow chart of FIG. 16, and a description of the steps will be omitted.

The image display means 602 may be operated only by voice. The image display means 1903 also allows normal operation using a mouse, touch panel, keyboard, or the like. That is, the image display means 1903 allows multimodal operation.

With this arrangement, the layout of job parameters or an image of a sample shot can easily be viewed with a common image display means even in a processing apparatus other than an exposure apparatus, and parameters can be modified by voice instructions regardless whether they are related to an image. This facilitates the handling of job parameters. The layout of a job parameter file or an image of a sample shot can easily be viewed with a common standard tool in a piece of equipment other than an exposure apparatus. For example, the details of processes performed by jobs can easily be known before loading a job parameter file into an exposure apparatus. This facilitates the handling of a job parameter file.

In addition, the layout of job parameters or an image of a sample shot can easily be viewed with a common standard tool in a piece of equipment other than an exposure apparatus, and parameters can be modified regardless whether they are related to an image. This facilitates the handling of job parameters.

Moreover, the layout of job parameters or an image of a sample shot can easily be viewed with a common standard tool in a piece of equipment other than an exposure apparatus, and parameters can be modified by voice instructions regardless whether they are related to an image. This facilitates the handling of job parameters.

Figure 20:
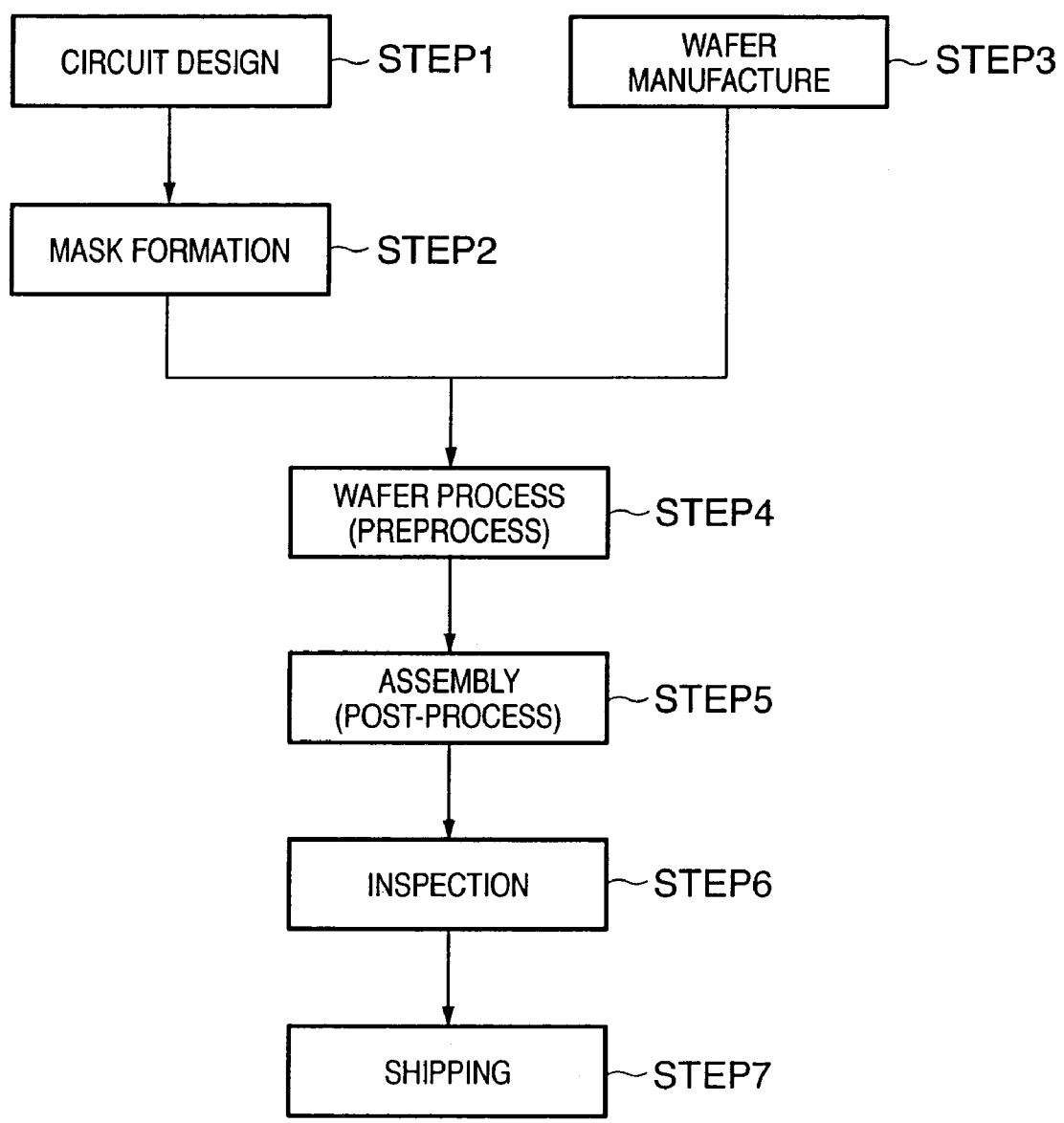
FIG. 20 is a flow chart showing the flow of the whole manufacturing process of a semiconductor device.

The manufacturing process of a semiconductor device as an example of a device such as a microdevice using the above-mentioned exposure system or apparatus will be described next. FIG. 20 shows the flow of the whole manufacturing process of the semiconductor device. In step 1 (circuit design), a semiconductor device circuit is designed. In step 2 (mask formation), a mask having the designed circuit pattern is formed.

In step 3 (wafer manufacture), a wafer (substrate) is manufactured by using a material such as silicon. In step 4 (wafer process), called a preprocess, an actual circuit is formed on the wafer by lithography using the prepared mask and wafer. Step 5 (assembly), called a post-process, is the step of forming a semiconductor chip by using the wafer formed in step 4, and includes an assembly process (dicing and bonding) and a packaging process (chip encapsulation). In step 6 (inspection), the semiconductor device manufactured in step 5 undergoes inspections, such as an operation confirmation test and a durability test of the semiconductor device manufactured in step 5. After these steps, the semiconductor device is completed and shipped (step 7).

The wafer process in step 4 comprises the following steps. More specifically, the wafer process includes an oxidation step of oxidizing the wafer surface, a CVD step of forming an insulating film on the wafer surface, an electrode formation step of forming an electrode on the wafer by vapor deposition, an ion implantation step of implanting ions in the wafer, a resist processing step of applying a photosensitive agent to the wafer, an exposure step of transferring the circuit pattern onto the wafer having undergone the resist processing step using the above-mentioned exposure apparatuses, a development step of developing the wafer exposed in the exposure step, an etching step of etching the resist except for the resist image developed in the development step, and a resist removal step of removing an unnecessary resist after etching. These steps are repeated to form multiple circuit patterns on the wafer.

According to the present invention, the working efficiency can be increased in exposure processing.

As many apparently widely different embodiments of the present invention can be made without departing from the spirit and scope thereof, it is to be understood that the invention is not limited to the specific embodiments thereof except as defined in the claims.

What is claimed is:

1. An information processing apparatus in an exposure system, said information processing apparatus comprising:

a generation unit which generates a parameter file described in a markup language based on a parameter used in the exposure system, the parameter file including information for displaying an image concerning at least one of a shot layout and a sample shot for an exposure process to be performed by the exposure system, and a program for editing the image; and a providing unit which provides the parameter file generated by the generation unit to another information processing apparatus arranged outside of the exposure system; and a reception unit which receives the parameter file from the other information processing apparatus, the parameter file being edited by the other information processing apparatus using the markup language, wherein the other information processing apparatus displays the image using the markup language.

2. An apparatus according to claim 1, wherein the program is described in a script language.

3. An apparatus according to claim 1, further comprising a first reception unit which receives the parameter from the exposure system.

4. An apparatus according to claim 1, wherein said providing unit transmits the parameter file to the other information processing apparatus.

5. An apparatus according to claim 1, further comprising a transmitting unit which transmits a parameter edited via the program to the exposure system.

6. An information processing method used in an exposure system, said method comprising steps of:

generating a parameter file described in a markup language based on a parameter used in the exposure system, the parameter file including information for displaying an image concerning at least one of a shot layout and a sample shot for an exposure process to be performed by the exposure system, the parameter file being generated in the exposure system, and a program for editing the image;

providing the parameter file generated in the exposure system to another information processing apparatus arranged outside of the exposure system;

displaying the image by the other information processing apparatus using the markup language;

receiving the parameter file from the other information processing apparatus, the parameter file being edited by the other information processing apparatus using the markup language; and transmitting a parameter in the received parameter file to the exposure system.

7. A method according to claim 6, wherein the program is described in a script language.

8. A method according to claim 6, further comprising a first reception step of receiving the parameter from the exposure system.

9. A method according to claim 6, wherein said providing step transmits the parameter file to the other information processing apparatus.

* * * * *

UNITED STATES PATENT AND TRADEMARK OFFICE
CERTIFICATE OF CORRECTION

| | |
|---|---|
| PATENT NO. | : 7,016,755 B2 |
| APPLICATION NO. | : 10/728817 |
| DATED | : March 21, 2006 |
| INVENTOR(S) | : Yuji Abuku |

It is certified that error appears in the above-identified patent and that said Letters Patent is hereby corrected as shown below:

IN THE DRAWINGS:
On "Sheet 10 of 22," in "FIG. 10A," the third line down from the top of the box, "http://www.w3.org/TR/2001/REC-SVG-20010904/DTD/svg10.dtd">", which has been struck through, should be deleted.
On "Sheet 18 of 22," in "FIG. 17A," the third line down from the top of the box, "http://www.w3.org/TR/2001/REC-SVG-20010904/DTD/svg10.dtd">", which has been struck through, should be deleted.

COLUMN 2:
Line 29, "mark" should read -- markup --.

COLUMN 6:
Line 34, "information" should read -- information portion 503 has image display information --.
Line 62, "method" should read -- method and --.

COLUMN 7:
Line 24, "test" should read -- text --.

COLUMN 10:
Line 10, "portion 1006" should read -- portion 1106 --.
Line 13, "110," should read -- 1109, --.
Line 14, "portion 110" should read -- portion 1110 --.

COLUMN 11:
Line 40, "portion 403," should read -- portion 503, --.

COLUMN 13:
Line 15, "tags>" should read -- tags <desc> --.
Line 23, "CPU 33," should read -- CPU 331, --.
Line 56, "Then 1" should read -- Then, --.

COLUMN 14:
Line 13, "<?Adobe" should read -- "<?Adobe --.

COLUMN 15:
Line 5, "URL(("URL" should read -- URL("URL --.

UNITED STATES PATENT AND TRADEMARK OFFICE
CERTIFICATE OF CORRECTION

PATENT NO.         : 7,016,755 B2
APPLICATION NO. : 10/728817
DATED              : March 21, 2006
INVENTOR(S)        : Yuji Abuku It is certified that error appears in the above-identified patent and that said Letters Patent is hereby corrected as shown below:

COLUMN 16:
Line 32, "operation" should read -- operation, --.

Signed and Sealed this

Thirty-first Day of October, 2006

JON W. DUDAS
*Director of the United States Patent and Trademark Office*